(12) United States Patent
Kahn et al.

(10) Patent No.: US 12,388,285 B2
(45) Date of Patent: Aug. 12, 2025

(54) BATTERY MANAGEMENT CONTROLLERS AND ASSOCIATED METHODS

(71) Applicant: Element Energy, Inc., Menlo Park, CA (US)

(72) Inventors: Seth Marshall Kahn, Sonoma, CA (US); Corrado Cammi, Mountain View, CA (US); Anthony John Stratakos, Edgartown, MA (US)

(73) Assignee: Element Energy, Inc., Menlo Park, CA (US)

( * ) Notice: Subject to any disclaimer, the term of this patent is extended or adjusted under 35 U.S.C. 154(b) by 0 days.

(21) Appl. No.: 18/519,434

(22) Filed: Nov. 27, 2023

(65) Prior Publication Data

US 2024/0088700 A1     Mar. 14, 2024

Related U.S. Application Data

(63) Continuation of application No. 17/369,523, filed on Jul. 7, 2021, now Pat. No. 11,831,192.

(51) Int. Cl.
| | | |
|---|---|---|
| H02J 7/00 | (2006.01) | |
| G01R 31/382 | (2019.01) | |
| G01R 31/385 | (2019.01) | |
| H01M 10/44 | (2006.01) | |

(52) U.S. Cl.
CPC ........ H02J 7/00714 (2020.01); G01R 31/382 (2019.01); G01R 31/385 (2019.01); H01M 10/441 (2013.01); H02J 7/0014 (2013.01); H02J 7/0024 (2013.01); H02J 7/0025 (2020.01)

(58) Field of Classification Search
CPC .... H02J 7/00714; H02J 7/0014; H02J 7/0024; H02J 7/0025; H02J 7/0016; G01R 31/382; G01R 31/385; H01M 10/441; H01M 2010/4271; H01M 10/482; Y02E 60/10
USPC ......................................... 320/116
See application file for complete search history.

(56) References Cited

U.S. PATENT DOCUMENTS

| | | |
|---|---|---|
| 5,341,503 A | 8/1994 | Gladstein et al. |
| 6,160,441 A | 12/2000 | Stratakos et al. |
| 6,262,558 B1 | 7/2001 | Weinberg |
| 6,445,244 B1 | 9/2002 | Stratakos et al. |

(Continued)

FOREIGN PATENT DOCUMENTS

| | | | |
|---|---|---|---|
| CN | 202182410 U | * 4/2012 | ............... F21S 9/03 |
| WO | 2015200366 A1 | 12/2015 | |

OTHER PUBLICATIONS

Walker, Geoffrey R., et al., "Cascaded DC-DC Converter Connection of Photovoltaic Modules", IEEE Transactions on Power Electronics, vol. 19, No. 4, (Jul. 2004), 1130-1139.

(Continued)

*Primary Examiner* — M Baye Diao
(74) *Attorney, Agent, or Firm* — PdZ Patent Law, PLLC

(57) ABSTRACT

A method for managing a plurality of batteries that are electrically coupled together includes (1) monitoring respective voltages of the plurality of batteries and (2) in response to a respective voltage of a first battery of the plurality of batteries reaching a first threshold value at a first time, reducing a charge or discharge rate of the first battery, relative to at least a second battery of the plurality of batteries. Charge and discharge rates may be adaptively managed such that each battery reaches the first threshold value at substantially the same time.

18 Claims, 16 Drawing Sheets

(56) References Cited

U.S. PATENT DOCUMENTS

| | | | |
|---|---|---|---|
| 6,835,491 B2 | 12/2004 | Gartstein | |
| 6,984,970 B2 | 1/2006 | Capel | |
| 7,068,017 B2 | 6/2006 | Willner et al. | |
| 8,158,877 B2 | 4/2012 | Klein et al. | |
| 8,395,519 B2 | 3/2013 | Cassidy | |
| 8,686,693 B2 | 4/2014 | Bhowmik et al. | |
| 9,172,120 B2 | 10/2015 | Pariseau | |
| 9,331,497 B2 | 5/2016 | Beaston | |
| 9,425,631 B2 | 8/2016 | Furtner | |
| 9,431,837 B2 * | 8/2016 | Brockman | H02J 7/00306 |
| 9,705,341 B2 | 7/2017 | Komatsu et al. | |
| 9,806,545 B2 | 10/2017 | Fink | |
| 9,865,901 B2 | 1/2018 | Hwang | |
| 9,912,017 B1 * | 3/2018 | Kuo | H01M 10/425 |
| 10,018,682 B2 | 7/2018 | Kaupp et al. | |
| 10,153,651 B2 | 12/2018 | Taylor et al. | |
| 10,270,262 B2 | 4/2019 | Kim et al. | |
| 10,553,851 B2 | 2/2020 | Kim | |
| 10,734,828 B2 | 8/2020 | Fasching et al. | |
| 10,804,690 B2 | 10/2020 | Ronne et al. | |
| 10,981,557 B2 * | 4/2021 | Ye | B60W 20/13 |
| 10,992,149 B1 | 4/2021 | Kahn et al. | |
| 11,237,216 B1 * | 2/2022 | Chang | G01R 31/388 |
| 2005/0121067 A1 | 6/2005 | Toyomura et al. | |
| 2005/0139258 A1 | 6/2005 | Liu et al. | |
| 2008/0236648 A1 | 10/2008 | Klein et al. | |
| 2008/0303503 A1 | 12/2008 | Wolfs | |
| 2009/0284078 A1 | 11/2009 | Zhang et al. | |
| 2009/0284232 A1 | 11/2009 | Zhang et al. | |
| 2009/0284240 A1 | 11/2009 | Zhang et al. | |
| 2009/0284998 A1 | 11/2009 | Zhang et al. | |
| 2010/0207455 A1 | 8/2010 | Erickson, Jr. et al. | |
| 2010/0253150 A1 | 10/2010 | Porter et al. | |
| 2010/0288327 A1 | 11/2010 | Lisi et al. | |
| 2010/0327659 A1 | 12/2010 | Lisi et al. | |
| 2011/0062784 A1 | 3/2011 | Wolfs | |
| 2011/0090607 A1 | 4/2011 | Luebke et al. | |
| 2011/0141644 A1 | 6/2011 | Hastings et al. | |
| 2011/0301772 A1 | 12/2011 | Zuercher et al. | |
| 2012/0013201 A1 | 1/2012 | Pariseau | |
| 2012/0043818 A1 | 2/2012 | Stratakos et al. | |
| 2012/0043823 A1 | 2/2012 | Stratakos et al. | |
| 2012/0043923 A1 | 2/2012 | Ikriannikov et al. | |
| 2012/0044014 A1 | 2/2012 | Stratakos et al. | |
| 2012/0112760 A1 | 5/2012 | Yoscovich et al. | |
| 2012/0119746 A1 | 5/2012 | Macris | |
| 2012/0133521 A1 | 5/2012 | Rothkopf et al. | |
| 2013/0092208 A1 | 4/2013 | Robbins | |
| 2013/0106194 A1 | 5/2013 | Jergovic et al. | |
| 2013/0170084 A1 | 7/2013 | Strobl et al. | |
| 2013/0176401 A1 | 7/2013 | Monari et al. | |
| 2014/0253045 A1 | 9/2014 | Poznar | |
| 2014/0368205 A1 | 12/2014 | Svensson et al. | |
| 2014/0373894 A1 | 12/2014 | Stratakos et al. | |
| 2016/0372940 A1 | 12/2016 | Canadi | |
| 2017/0123008 A1 | 5/2017 | Frias et al. | |
| 2018/0147947 A1 | 5/2018 | Gebhart | |
| 2019/0051892 A1 * | 2/2019 | Yushin | H01G 11/32 |
| 2019/0198938 A1 | 6/2019 | Fujita et al. | |
| 2019/0361075 A1 | 11/2019 | Lee et al. | |
| 2020/0067324 A1 * | 2/2020 | Zou | H01M 10/0525 |
| 2020/0127489 A1 | 4/2020 | Chen et al. | |
| 2020/0207219 A1 | 7/2020 | Slepchenkov et al. | |
| 2020/0321787 A1 * | 10/2020 | Miller | H01M 10/441 |
| 2020/0350779 A1 | 11/2020 | Tikhonski et al. | |
| 2023/0011716 A1 | 1/2023 | Kahn et al. | |

OTHER PUBLICATIONS

Wolfs, Peter, et al., "Distributed Maximum Power Tracking for High Performance Vehicle Solar Arrays", Australian Universities Power Engineering Conference (AUPEC 2004), (Sep. 2004), 6 pgs.

Anderson, R. Dyche et al., "Life-Balancing—A Better Way to Balance Large Batteries," SAE World Congress Experience, Apr. 4-6, 2017, Detroit, Michigan, 6 pgs.

Rehman M. Muneeb UR et al., "Advanced Cell-level Control for Extending Electric Vehicle Battery Pack Lifetime", IEEE, 2016, 8 pgs.

Abstract Only, Altaf, Faisal et al., "Simultaneous Thermal and State-of-Charge Balancing of Batteries: A Review", 2014 IEEE Vehicle Power and Propulsion Conference (VPCC), 4 pgs.

Abstract Only, Barreras, Jorge V., "Multi-Objective Control of Balancing Systems for Li-Ion Battery Packs: A Paradigm Shift?", 2014 IEEE Vehicle Power and Propulsion Conference (VPPC), 4 pages.

* cited by examiner

1900

```
┌─────────────────────────────────────────────────────────────┐
│                                                             │
│     Monitor Respective Voltages of a Plurality of Batteries │
│                                                        1902 │
└─────────────────────────────────────────────────────────────┘
                              │
                              ▼
┌─────────────────────────────────────────────────────────────┐
│  In Response to a Respective Voltage of a First Battery of  │
│  the Plurality of Batteries Reaching a Threshold Value at a │
│  First Time, Reducing a Charge or Discharge Rate of the     │
│  First Battery, Relative to at Least a Second Battery of the│
│                   Plurality of Batteries               1904 │
└─────────────────────────────────────────────────────────────┘
                              │
                              ▼
┌─────────────────────────────────────────────────────────────┐
│  In Response to a Respective Voltage of the Second Battery  │
│  Reaching the First Threshold Value at a Second Time that is│
│  After the First Time, Increasing the Respective Charge or  │
│              Discharge Rate of the First Battery            │
│                                                        1906 │
└─────────────────────────────────────────────────────────────┘
```

FIG. 19

BATTERY MANAGEMENT CONTROLLERS AND ASSOCIATED METHODS

RELATED APPLICATIONS

This application is a continuation of U.S. patent application Ser. No. 17/369,523, filed on Jul. 7, 2021, which is incorporated herein by reference.

BACKGROUND

A battery is a device including one or more electrochemical cells that may be discharged to convert chemical energy into electrical energy. Batteries may be grouped into primary batteries and secondary batteries. A primary battery is a single-use device which undergoes an irreversible change during its discharge. A secondary battery, in contrast, can be recharged by applying an electric current to the battery, and a secondary battery can therefore be discharged and recharged multiple times.

Batteries are widely used as electrical power sources in applications where a continuous connection to a fixed electric power source, such as an electric utility grid, is undesirable or infeasible. For example, batteries are widely used to power mobile information technology devices, such as mobile telephones and tablet computers. Additionally, batteries are increasingly being used as a power source in vehicles, either as a vehicle's sole power source or to supplement a vehicle's internal combustion engine. It is anticipated that batteries will largely supplant internal combustion engines in future new vehicles.

Furthermore, there is great interest in using batteries in electric infrastructure to store energy. For example, an electric utility may charge a battery to store energy when there is a surplus of electrical power, and the electric utility may subsequently discharge the battery to withdraw the stored energy when additional electrical power is needed. Accordingly, batteries are anticipated to be a key component in the ongoing transition from fossil fuel electrical power sources to renewable electric power sources, as batteries can compensate for the intermittent nature of renewable electric power sources.

One popular battery is the Lithium-ion (Li-ion) battery. Examples of Li-ion batteries include Lithium Cobalt Oxide (LCO) batteries, Lithium Manganese Oxide (LMO) batteries, Lithium Nickel Manganese Cobalt Oxide (NMC) batteries, Lithium Iron Phosphate (LFP) batteries, Lithium Nickel Cobalt Aluminum Oxide (NCA) batteries, and Lithium Titanate (LTO) batteries. Li-ion batteries advantageously have a high energy density relative to most other secondary batteries. However, Li-ion batteries can easily be damaged by operation outside of their intended operating range, such as by overcharging the battery or by excessively discharging the battery. Additionally, the high energy density of Li-ion batteries makes them susceptible to catching fire or exploding in case of battery damage or battery failure. Battery management systems, which control battery operation, such as battery charging and discharging, are therefore used with Li-ion batteries (and other batteries) to help achieve long battery life and safe battery operation.

SUMMARY

In a first aspect, a method for managing a plurality of batteries that are electrically coupled together includes (a) monitoring respective voltages of the plurality of batteries and (b) in response to a respective voltage of a first battery of the plurality of batteries reaching a first threshold value at a first time, reducing a charge or discharge rate of the first battery, relative to at least a second battery of the plurality of batteries.

In an embodiment of the first aspect, reducing the charge or discharge rate of the first battery relative to at least the second battery of the plurality of batteries includes changing operation of a first DC-to-DC converter electrically coupled to the first battery independently of operation of a second DC-to-DC converter electrically coupled to the second battery.

In another embodiment of the first aspect, the first and second DC-to-DC converters are electrically coupled in series.

In another embodiment of the first aspect, the method further includes increasing a charge or discharge rate of the second battery to compensate for reducing the charge or discharge rate of the first battery.

In another embodiment of the first aspect, reducing the charge or discharge rate of the first battery includes changing operation of a first DC-to-DC converter electrically coupled to the first battery, and increasing the charge or discharge rate of the second battery comprises changing operation of a second DC-to-DC converter electrically coupled to the second battery.

In another embodiment of the first aspect, the method further includes increasing the respective charge or discharge rate of the first battery in response to a respective voltage of the second battery reaching the first threshold value at a second time that is after the first time.

In another embodiment of the first aspect, the method further includes, after step (b), adaptively managing charge or discharge rates of the plurality of batteries such that each battery reaches the first threshold value at substantially the same time.

In another embodiment of the first aspect, adaptively managing charge or discharge rates of the plurality of batteries include changing a charge or discharge rate of the first battery relative to the second battery.

In another embodiment of the first aspect, adaptively managing charge or discharge rates of the plurality of batteries includes changing a charge or discharge rate of the second battery relative to the first battery.

In another embodiment of the first aspect, adaptively managing charge or discharge rates of the plurality of batteries includes using an iterative process to reduce a difference in time when the first and second batteries reach the first threshold value.

In another embodiment of the first aspect, adaptively managing charge or discharge rates of the plurality of batteries includes using historical data from an energy storage system to determine how to adjust a charge or discharge rate of one or more of the plurality of batteries, such that each battery reaches the first threshold value at substantially the same time.

In another embodiment of the first aspect, the respective voltages of the plurality of batteries include one of (a) actual battery voltages, (b) actual battery open circuit voltages, and (c) estimated battery open circuit voltages.

In another embodiment of the first aspect, the first threshold value corresponds to one of (a) a knee in a battery voltage versus state of charge curve and (b) a knee in a battery voltage versus time curve.

In another embodiment of the first aspect, the first threshold value corresponds to one of (a) a predetermined change in the respective voltage of the first battery and (b) a predetermined rate of change in the respective voltage of the first battery.

In another embodiment of the first aspect, each battery is a battery module including either (a) a plurality of electrochemical cells or (b) a single electrochemical cell.

In a second aspect, a controller for managing a plurality of batteries that are electrically coupled together includes (1) one or more memories and (2) one or more processors communicatively coupled to the one or more memories. The one or more processors are configured to execute instructions stored in the one or memories to (1) monitor respective voltages of the plurality of batteries, and (2) in response to a respective voltage of a first battery of the plurality of batteries reaching a first threshold value at a first time, reduce a charge or discharge rate of the first battery, relative to at least a second battery of the plurality of batteries.

In an embodiment of the second aspect, the one or more processors are further configured to execute instructions stored in the one or more memories to increase a charge or discharge rate of the second battery to compensate for reducing the charge or discharge rate of the first battery.

In another embodiment of the second aspect, the one or more processors are further configured to execute instructions stored in the one or more memories to increase the respective charge or discharge rate of the first battery, in response to a respective voltage of the second battery reaching the first threshold value at a second time that is after the first time.

In another embodiment of the second aspect, the one or more processors are further configured to execute instructions stored in the one or more memories to adaptively manage charge or discharge rates of the plurality of batteries such that each battery reaches the first threshold value at substantially the same time.

In another embodiment of the second aspect, the one or more processors are further configured to execute instructions stored in the one or more memories to adaptively manage charge or discharge rates of the plurality of batteries using an iterative process.

In another embodiment of the second aspect, the one or more processors are further configured to execute instructions stored in the one or more memories to adaptively manage charge or discharge rates of the plurality of batteries using historical data from an energy storage system.

In another embodiment of the second aspect, the first threshold value corresponds to one of (a) a knee in a battery voltage versus state of charge curve and (b) a knee in a battery voltage versus time curve.

In another embodiment of the second aspect, the first threshold value corresponds to one of (a) a predetermined change in the respective voltage of the first battery and (b) a predetermined rate of change in the respective voltage of the first battery.

BRIEF DESCRIPTION OF THE DRAWINGS

FIG. 19 is a flow chart of a method for managing a plurality of batteries that are electrically coupled together, to mitigate effects of dead band operation on battery state of charge balancing, according to an embodiment.

DETAILED DESCRIPTION OF THE EMBODIMENTS

Disclosed herein are new battery management controllers and associated methods which significantly advance the state of the start. Certain embodiments of the new controllers and methods advantageously help achieve greater battery throughput, greater battery lifetime, and/or greater battery safety, than what is feasible when using conventional battery management controllers. For example, certain embodiments are configured to improve battery state of charge balancing in applications where batteries exhibit an extremely flat open circuit voltage (OCV) characteristic (dead band), such as in applications including LFP batteries. In this document, the term "substantially" means within ten percent. For example, X is considered substantially equal to Y if X is greater than or equal to 90 percent of Y and less than or equal to 110 percent of Y. Furthermore, in this document, equivalent series resistance (ESR) of a battery may include resistance of electrical interconnects to and within the battery as well as equivalent series resistance of electrochemical cells within the battery.

Figure 1:
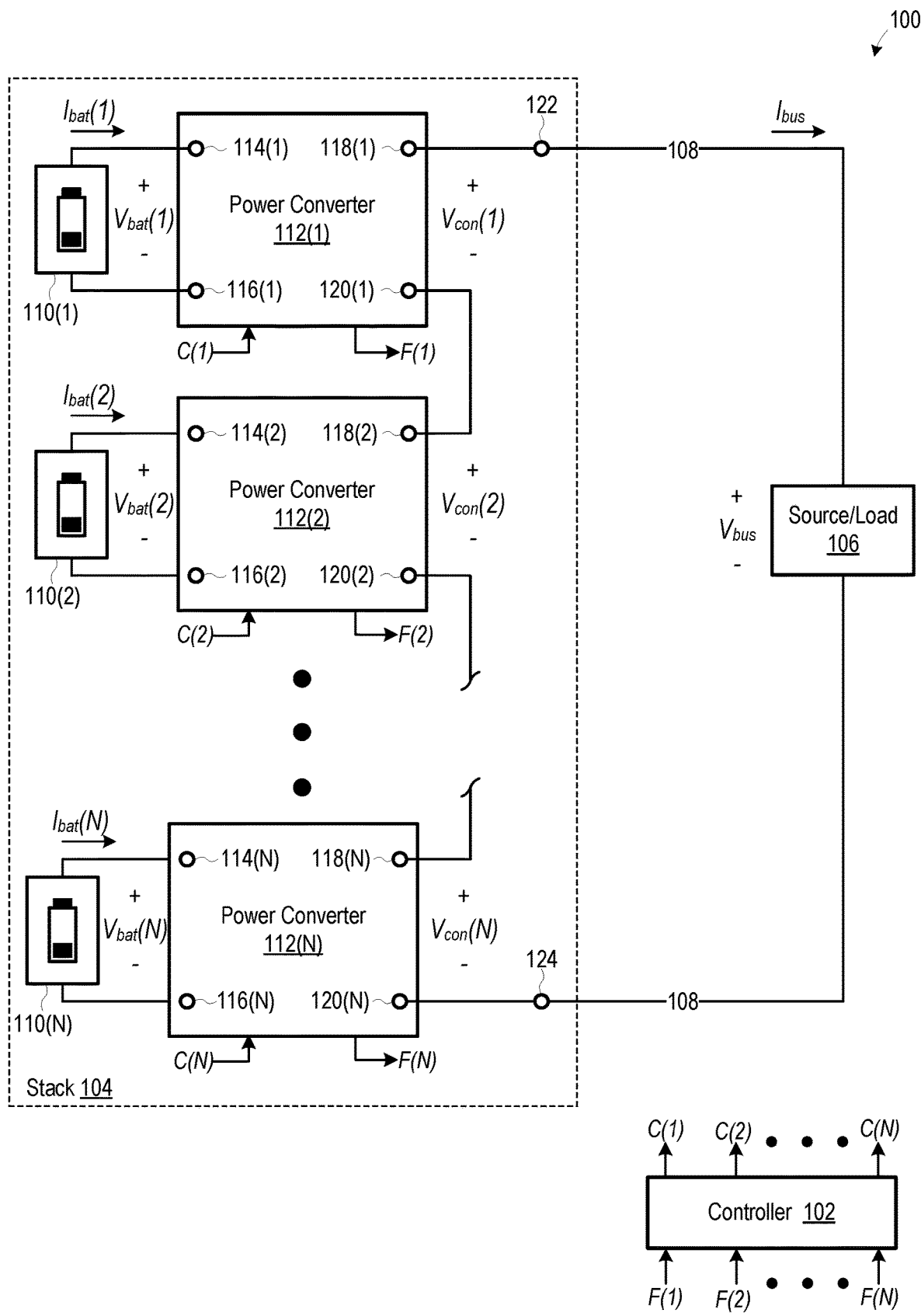
FIG. 1 is a schematic diagram of an energy storage system including a stack of batteries and power converters, according to an embodiment.

FIG. 1 is a schematic diagram of an energy storage system 100 including a battery management controller 102, a stack 104, a source/load 106, and an electric power bus 108, where battery management controller 102 is one embodiment of the new battery management controllers disclosed herein. Source/load 106 can operate as either an electric power source or as a load. Source/load 106 provides electric power to stack 104 when source/load 106 operates as an electric power source, and source/load 106 consumes electric power from stack 104 when source/load 106 operates as a load. In some embodiments, source/load 106 is an inverter which interfaces energy storage system 100 with an alternating current (AC) electric power system (not shown). In some other embodiments, source/load 106 is a direct current-to-direct current (DC-to-DC) converter which interfaces energy storage system 100 with a direct current (DC) electric power system (not shown). In certain additional embodiments, source/load 106 is an electromechanical device, e.g. a combination motor and generator, that can generate electric power as well as consume electric power. Additionally, source/load 106 may include a plurality of elements. For example, source/load 106 may include a photovoltaic array (not shown) as well as an inverter (not shown) electrically coupling energy storage system 100 with an AC electric power system (not shown). However, source/load 106 can take other forms without departing from the scope hereof.

Stack 104 includes N batteries 110 and N power converters 112, where N is an integer that is greater than or equal to one. In this document, specific instances of an item may be referred to by use of a numeral in parentheses (e.g. battery 110(1)) while numerals without parentheses refer to any such item (e.g. batteries 110). Each battery 110 is electrically coupled to input ports 114 and 116 of a respective power converter 112. Each battery 110 and its respective power converter 112 are sometimes referred to as a battery management system (BMS) node. Output ports 118 and 120 of power converters 112 are electrically coupled in series between stack ports 122 and 124. Specifically, output port 120(1) of power converter 112(1) is electrically coupled to output port 118(2) of power converter 112(2), output port 120(2) of power converter 112(2) is electrically coupled to output port 118(3) of power converter 112(3) (not explicitly shown in FIG. 1), and so on. Output port 118(1) of power converter 112(1) is electrically coupled to stack port 122, and output port 120(N) of power converter 112(N) is electrically coupled to stack port 124. Electric power bus 108 electrically couples stack ports 122 and 124 to source/load 106.

Figure 2:
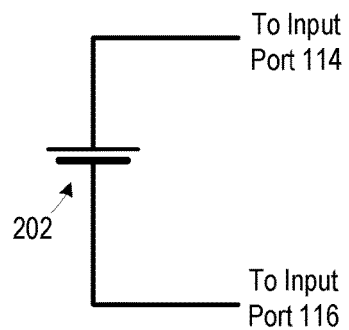
FIG. 2 is a schematic diagram of a battery that is a single electrochemical cell.
Figure 3:
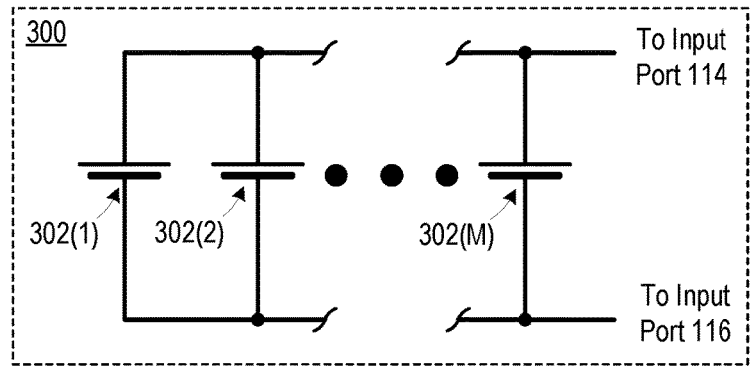
FIG. 3 is a schematic diagram of a battery including a plurality of electrochemical cells electrically coupled in parallel.
Figure 4:
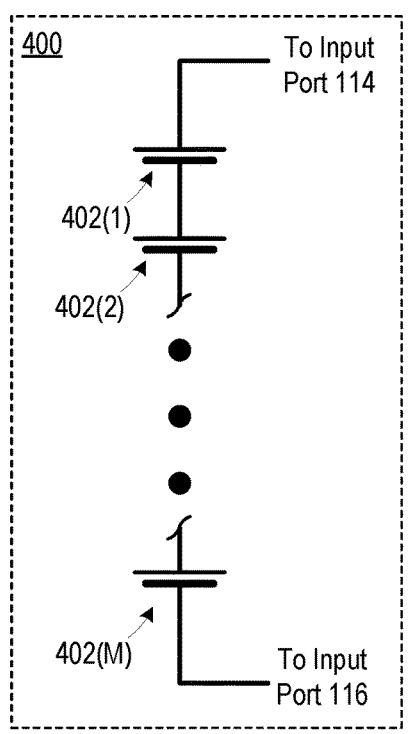
FIG. 4 is a schematic diagram of a battery including a plurality of electrochemical cells electrically coupled in series.
Figure 5:
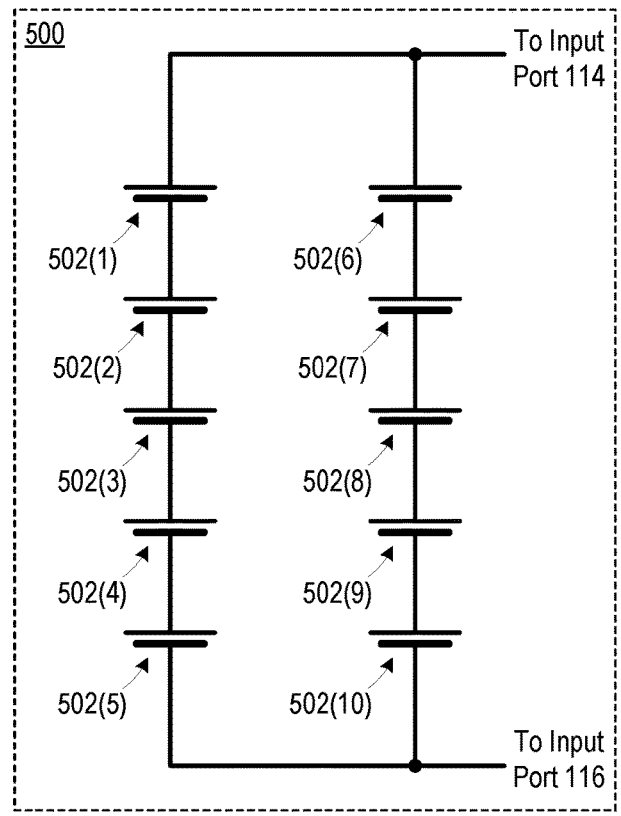
FIG. 5 is a schematic diagram of a battery including a plurality of electrochemical cells electrically coupled in a series/parallel combination.

Each battery 110 includes one or more electrochemical cells. For example, FIGS. 2-5 are schematic diagrams of possible embodiments of a battery 110, although batteries 110 are not limited to these embodiments. FIG. 2 is a schematic diagram of an electrochemical cell 202, which is an embodiment of a battery 110 where the battery 110 is a single electrochemical cell. FIGS. 3-5, in contrast, are schematic diagrams of embodiments of a battery 110 where the battery is an assembly, e.g. a module, of a plurality of electrochemical cells that are electrically coupled together. Specifically, FIG. 3 is a schematic diagram of a battery 300 including M electrochemical cells 302 electrically coupled in parallel, and FIG. 4 is a schematic diagram of a battery 400 including M electrochemical cells 402 electrically coupled in series, where M is an integer greater than one. FIG. 5 is a schematic diagram of a battery 500 including a plurality of electrochemical cells 502 electrically coupled in a series/parallel combination. In some embodiments, electrochemical cells 202, 302, 402, and 502 are Li-ion chemical cells, e.g., LCO chemical cells, LMO chemical cells, NMC chemical cells, LFP chemical cells, NCA chemical cells, or LTO chemical cells. However, electrochemical cells 202, 302, 402, and 502 can be other types of electrochemical cells, including future-developed electrochemical cells, without departing from the scope hereof.

Referring again to FIG. 1, battery management controller 102 is configured to generate a respective control signal C for each power converter 112, to enable battery management controller 102 to control operation of power converters 112. Additionally, battery management controller 102 is configured to receive a respective feedback signal F from each power converter 112. In some embodiments, each feedback signal F specifies, for its respective power converter 112 and associated battery 110, one or more of (a) voltage $V_{bat}$ across battery 110 (e.g., voltage across terminals of the battery), (b) current $I_{bat}$ flowing through battery 110, (c) voltage $V_{con}$ across the power converter 112's output ports 118 and 120, (d) current $I_{bus}$ flowing through the power converter 112's output ports 118 and 120, and (e) temperature of battery 110.

Signals C and F are communicated between controller 102 and power converters 112, for example, via one or more electrical conductors (not shown), one or more optical conductors (not shown), and/or one or more wireless transceivers (not shown). Although battery management controller 102 is illustrated as being a discrete element, battery management controller 102 could be at least partially incorporated in one or more batteries 110 and/or one or more power converters 112. Additionally, battery management controller 102 could be formed of multiple constituent elements which need not be co-packaged or even disposed at a common location. For example, in certain embodiments, at least some elements of battery management controller 102 are embodied by a distributed computing system, e.g. a "cloud" computing system, such as discussed below with respect to FIG. 7. As another example, in some embodiments, elements of battery management controller 102 are distributed among one or more stack controllers (not shown) and a central host controller (not shown), of energy storage system 100.

Figure 6:
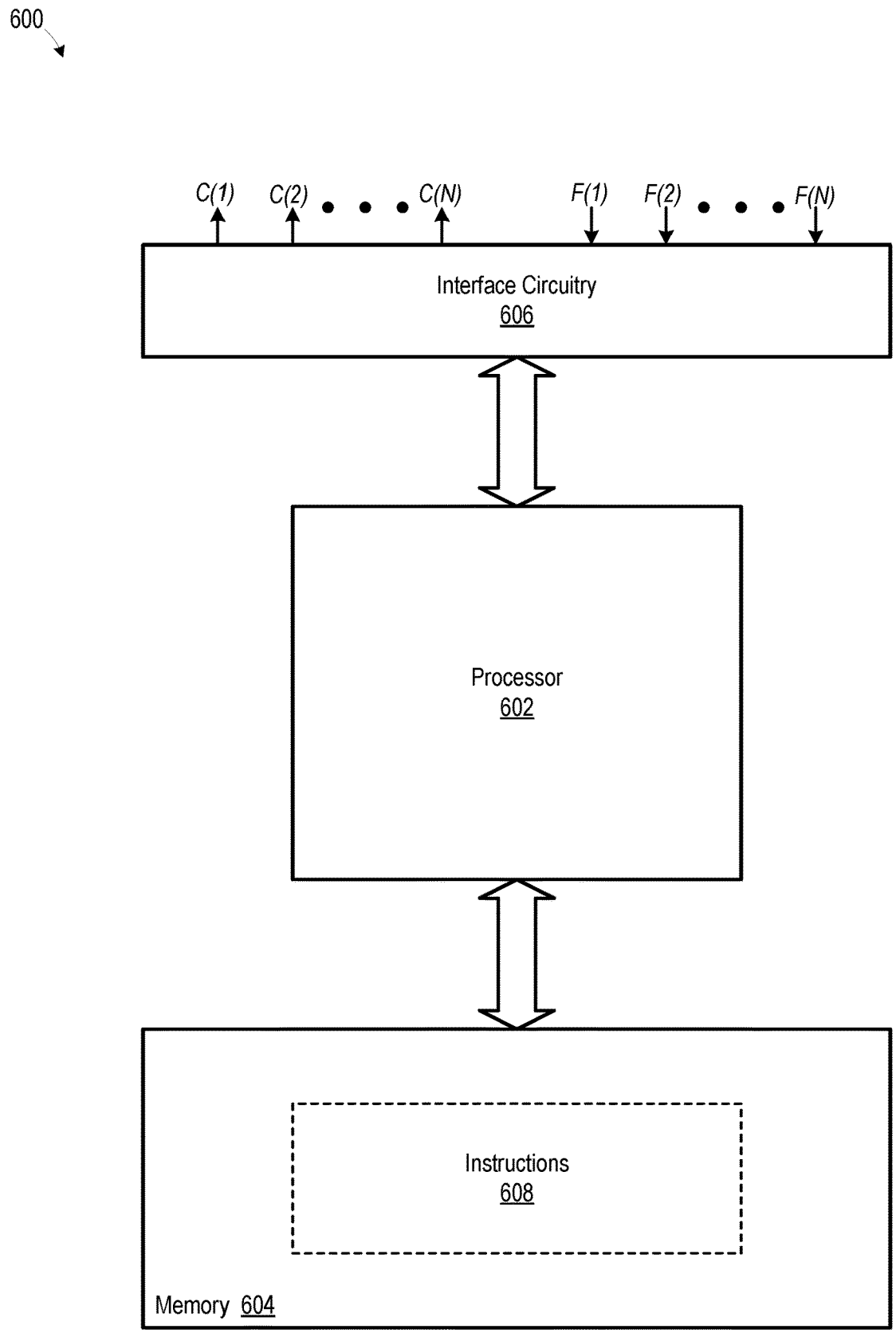
FIG. 6 is a schematic diagram of one embodiment of a battery management controller of the FIG. 1 energy storage system.

FIG. 6 is a schematic diagram of a battery management controller 600, which is one possible embodiment of battery management controller 102. Battery management controller 600 includes a processor 602, a memory 604, and interface circuitry 606. Processor 602 is communicatively coupled to each of memory 604 and interface circuitry 606, and processor 602 is configured to execute instructions 608, e.g., in the form of software and/or firmware, stored in memory 604, to generate control signals C at least partially in response to feedback signals F received from power converters 112. In some embodiments, battery management controller 600 is further configured to receive instructions and/or data from an external source, such as a battery data processing engine (not shown) remote from energy storage system 100. The battery data processing engine, for example, provides instructions to processor 602 to control at least some aspects of energy storage system 100 based on prior experience with other energy storage systems having on or more common traits with energy storage system 100.

Interface circuitry 606 interfaces processor 602 with one or more communication mediums (not shown) for transmitting signals C and F between battery management controller 600 and power converters 112. In some embodiments, interface circuitry 606 includes one or more electrical transceivers, optical transceivers, and/or wireless transceivers. Battery management controller 600 could include one or more additional processors and/or memories, and the elements of battery management controller 600 need not be co-packaged or even disposed at a common location. Additionally, battery management controller 600 could be modified to replace processor 602 and memory 604 with analog and/or digital circuitry which performs the same functions as processor 602 and memory 604.

Figure 7:
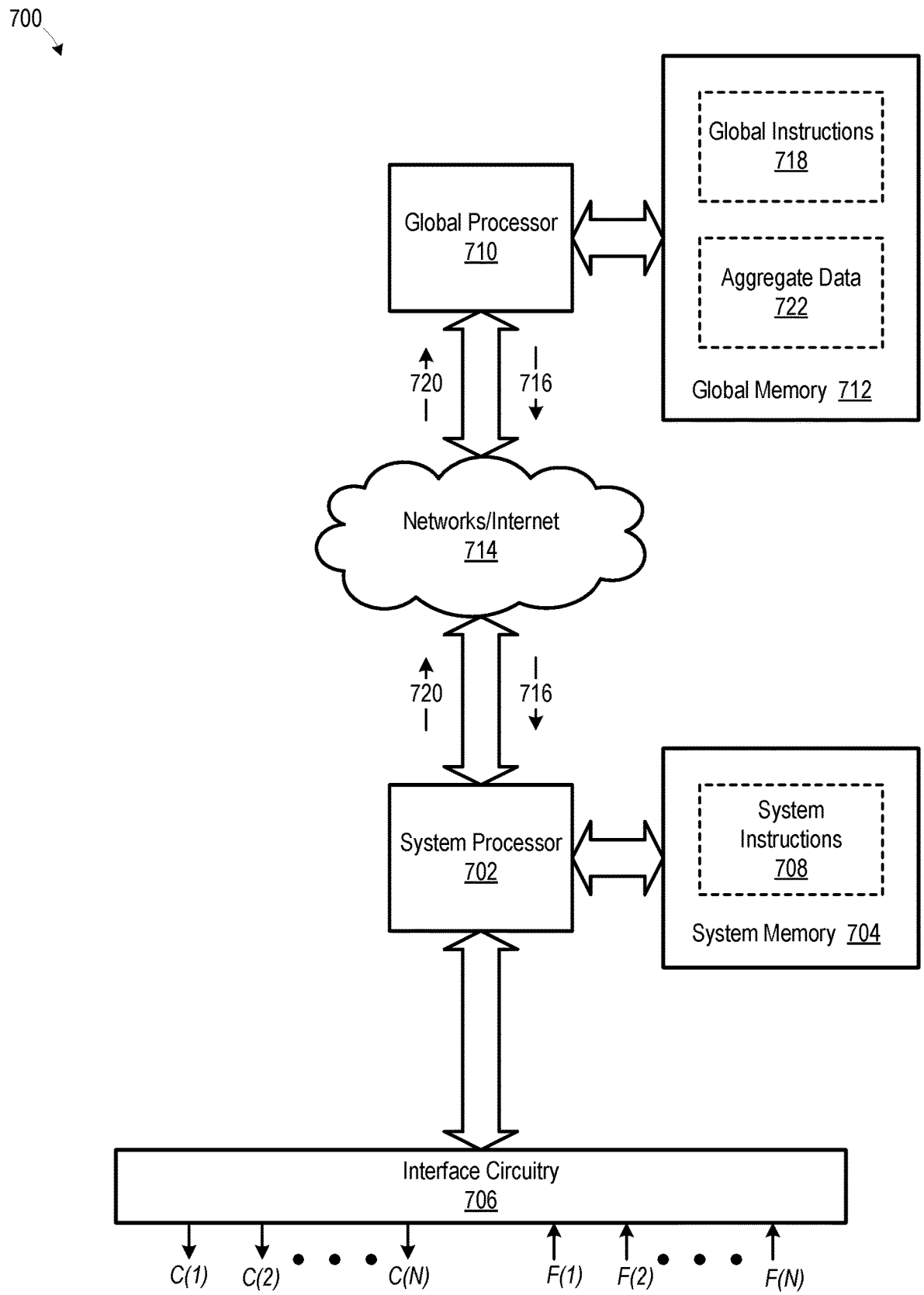
FIG. 7 is a schematic diagram of another embodiment of a battery management controller of the FIG. 1 energy storage system.

FIG. 7 is a schematic diagram of a battery management controller 700, which is another possible embodiment of battery management controller 102. Battery management controller 700 includes a system processor 702, a system memory 704, and interface circuitry 706 disposed at or near stack 104. Battery management controller 700 further includes a global processor 710 and a global memory 712 remote from stack 104. Although each of global processor 710 and global memory 712 are depicted as a single element, one or more of global processor 710 and global memory 712 may include multiple sub-elements which need not be disposed at a common location. For example, in some embodiments, global processor 710 and global memory 712 are implemented in a distributed computing environment. Networks/Internet 714 communicatively couple system processor 702 and global processor 710, and networks/Internet 714 need not be part of battery management controller 700. Additionally, global processor 710 and global memory 712 may be shared by one or more energy storage systems in addition to energy storage system 100, such that global processor 710 and global memory 712 are effectively part of a battery management controller of one or more additional energy storage systems.

System processor 702 is communicatively coupled to each of system memory 704 and interface circuitry 706, and system processor 702 is configured to execute instructions 708, e.g. in the form of software and/or firmware, stored in system memory 704, to generate control signals C at least partially in response to feedback signals F received from power converters 112 and instructions/data 716 received from global processor 710. Interface circuitry 706 is analogous to interface circuitry 606 of FIG. 6.

Global processor 710 is configured to execute instructions 718, in the form of software and/or firmware, stored in global memory 712 to perform one or more of the following functions. In some embodiments, global processor 710 is configured to receive system data 720 from system processor 702, where system data 720 represents one or more aspects of energy storage system 100. System processor 702 is configured to determine system data 720, for example, at least partially based on feedback signals F from power converters 112. By way of example and not limitation, system data 720 may include battery 110 temperature, battery voltage $V_{bat}$, battery current $I_{bat}$, the type of batteries 110 in energy storage system 100, the configuration of batteries 110 in energy storage system 100, manufacturing information for batteries 110 in energy storage system 100, operating history of batteries 110 in energy storage system 100, maintenance history of batteries 110 in energy storage system 100, etc. System data 720 is optionally encrypted, compressed, and/or preprocessed (e.g., identifying various degradation mechanisms and/or hazardous operating conditions) before being sent from system processor 702 to global processor 710.

Global processor 710 compares system data 720 to aggregate data 722 to find common traits between the two data sets. Aggregate data 722 includes data from multiple energy storage systems, e.g. from tens, hundreds, or even thousands of energy storage systems. Global processor 710 optionally adds information it receives from energy storage systems to aggregate data 722, such that aggregate data 722 grows over time. Examples of common traits between system data 720 and aggregate data 722 include, but are not limited to, batteries operating under the same or similar conditions, batteries with the same or similar operation duration, batteries with the same or similar energy throughput, batteries from a common manufacturing lot, batteries with the same or similar installation, batteries stored under the same or similar conditions, batteries with the same or similar maintenance history, and batteries with similar arc fault signatures. In some embodiments, global processor 710 uses self-learning methodologies (e.g., machine-learning, deep-learning, or even multi-modal machine learning) to identify common traits between system data 720 and aggregate data 722.

Global processor 710 subsequently identifies data that is applicable to energy storage system 100 from the common traits between system data 720 and aggregate data 722. More specifically, global processor 710 identifies data in aggregate data 722 that is associated with energy storage systems having common traits with energy storage system 100, as being applicable data. For example, global processor 710 may identify data from an energy storage system having the same type of batteries as energy storage system 100 as being applicable data. As another example, global processor 710 may identify data from an energy storage system operating under similar conditions to energy storage system 100 as being applicable data. The applicable data may be either indirectly related or directly related to data associated with energy storage systems having common traits with energy storage system 100. In some embodiments, global processor 710 uses self-learning methodologies (e.g., machine-learning, deep-learning, or even multi-modal machine learning) to identify the applicable data from aggregate data 722.

Global processor 710 determines instructions/data 716 from the applicable data. Instructions/data 716 may include instructions for energy storage system 100 based on the applicable data, and/or instructions/data 716 may include the applicable data itself. Global processor 710 sends instructions/data 716 to system processor 702. Energy storage system 100 optionally uses instructions/data 716 to manage one or more aspects of energy storage system 100. For example, in particular embodiments, battery management controller 700 uses instructions/data 716 to build or refine models of batteries 110, such as for controlling battery 110 charging/discharging or for identifying and/or mitigating degradation or failure mechanisms of batteries 110.

Figure 8:
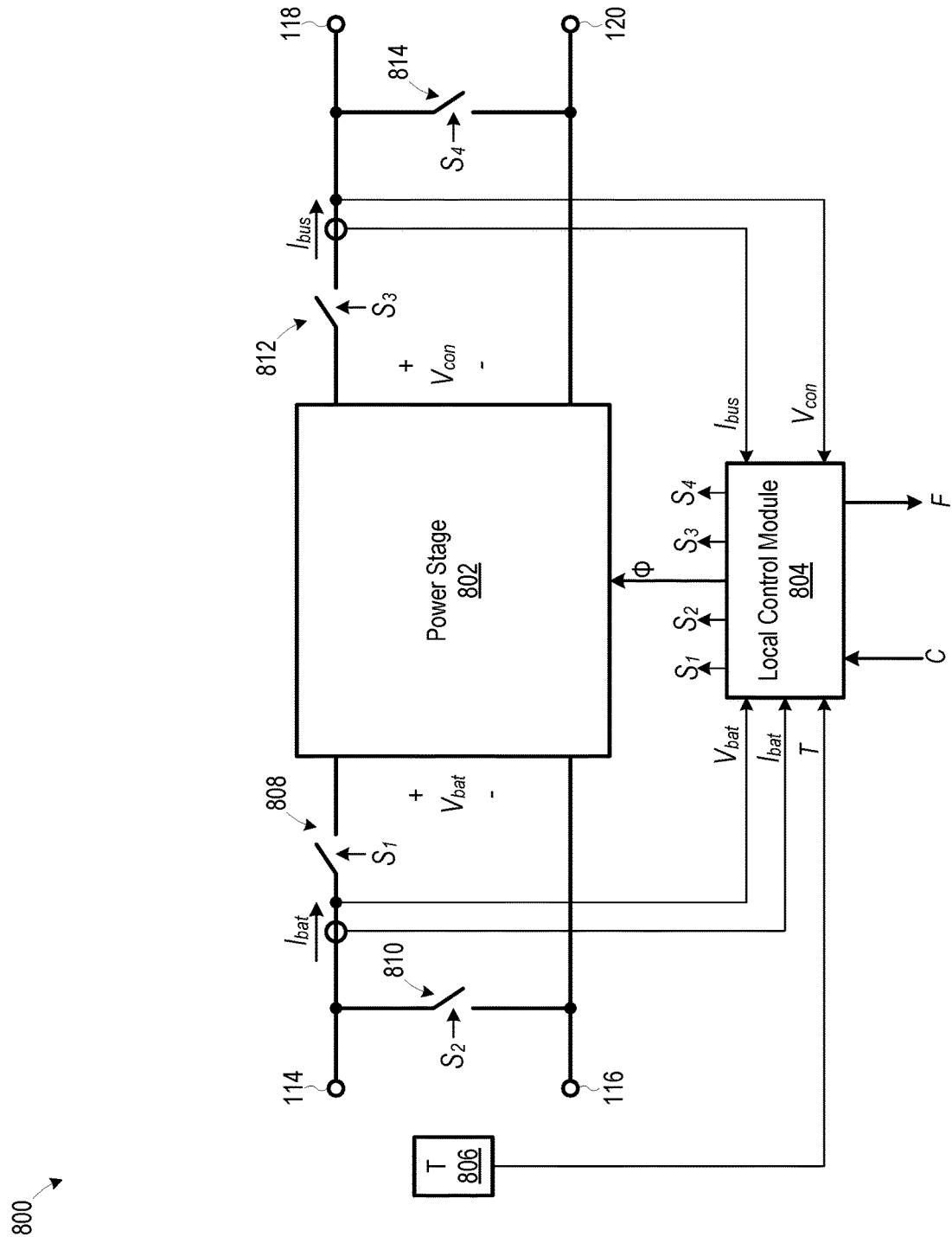
FIG. 8 is a schematic diagram of one embodiment of a power converter of the FIG. 1 energy storage system.

Referring again to FIG. 1, each power converter 112 buffers its respective battery 110 from electric power bus 108, and as discussed above, each power converter 112 generates a respective feedback signal F for controller 102. FIG. 8 is a schematic diagram of a power converter 800, which is one possible embodiment of a power converter 112. Power converter 800 includes a power stage 802, a local control module 804, a temperature sensor 806, a first switching device 808, a second switching device 810, a third switching device 812, and a fourth switching device 814. In some alternate embodiments, temperature sensor 806 is separate from power converter 800, e.g., temperature sensor 806 could be part of a battery 110, instead of part of power converter 800. Additionally, one or more of first switching device 808, second switching device 810, third switching device 812, and fourth switching device 814 may be omitted, such as in embodiments where the functionality realized by the switching devices is not required, or in embodiments where the functionality realized by the switching devices can be achieved by switching devices (not shown) within power stage 802. In this document, the term "switching device" includes, but is not limited to, one or more transistors, e.g., field effect transistors (FETs), bipolar junction transistors (BJTs), and/or insulated gate bipolar junction transistors (IGBTs), as well as one or more relays, contactors, or similar devices that are capable of opening and closing a circuit in response to a signal. Additionally, one or more of switching devices 808, 810, 812, and 814 can be replaced with, or supplemented by, one or more diodes, without departing from the scope hereof.

Power stage 802 is electrically coupled between (a) input ports 114 and 116 and (b) output ports 118 and 120. Power stage 802 is configured to perform one or more of the following power conversion functions, in response to switching signals φ generated by local control module 804: (a) transform voltage $V_{bat}$ across input ports 114 and 116 to voltage $V_{con}$ across output ports 118 and 120, (b) transform voltage $V_{con}$ across output ports 118 and 120 to voltage $V_{bat}$ across input ports 114 and 116, (c) transform current $I_{bat}$ flowing through battery 110 and input ports 114 and 116 to current $I_{bus}$ flowing through output ports 118 and 120 and electric power bus 108, and (d) transform current $I_{bus}$ flowing through output ports 118 and 120 and electric power bus 108 to current $I_{bat}$ flowing through battery 110 and input ports 114 and 116. In some embodiments, power stage 802 includes one or more of a non-isolated DC-to-DC switching converter, an isolated DC-to-DC switching converter, and a linear regulator.

Figure 9:
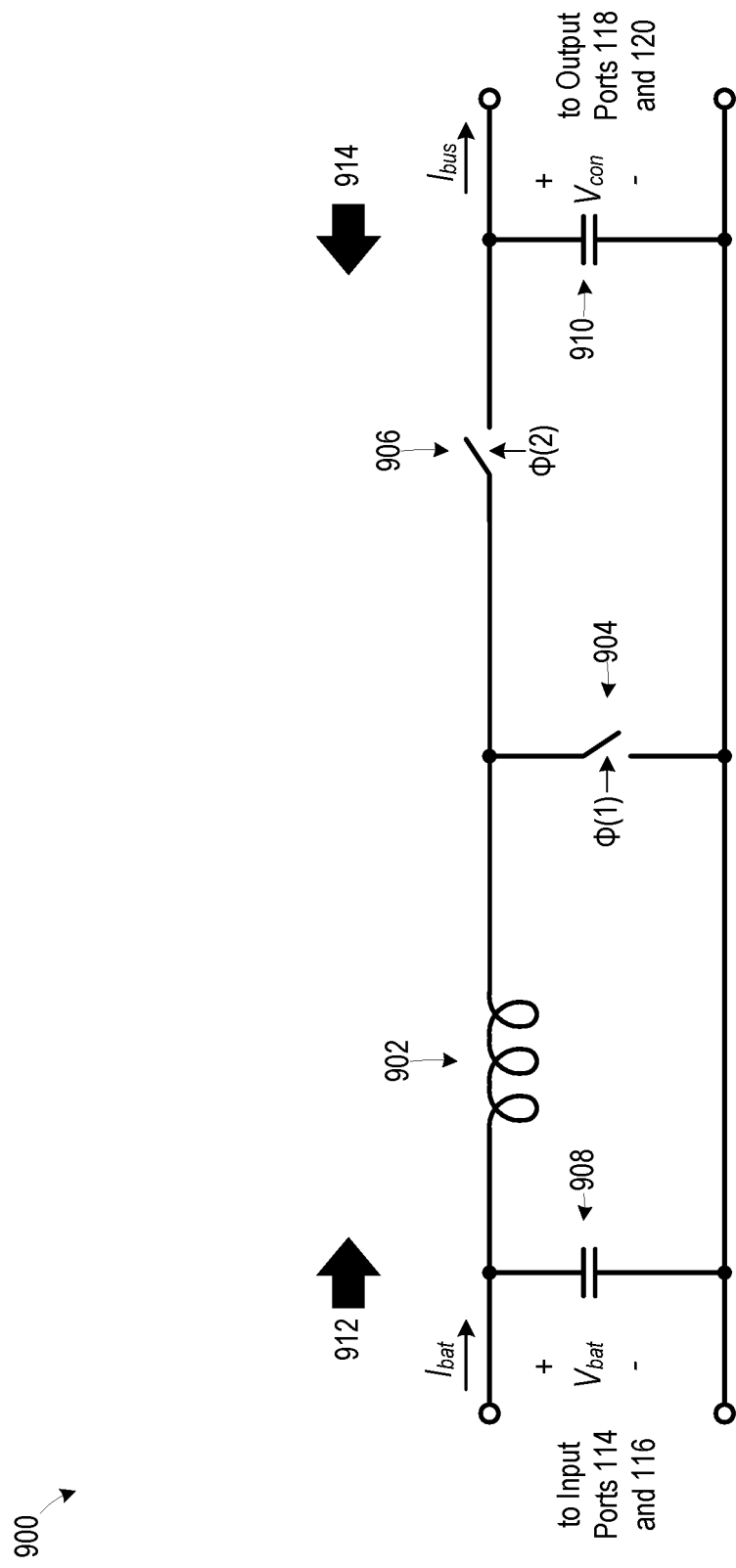
FIG. 9 is a schematic diagram of one embodiment of a power stage of the FIG. 8 power converter.

For example, FIG. 9 is a schematic diagram of a power stage 900, which is one possible embodiment of power stage 802 of FIG. 8. Power stage 900 includes an inductor 902, a first switching device 904, a second switching device 906, a first capacitor 908, and a second capacitor 910. Although inductor 902 is depicted as being a discrete element, inductor 902 could be distributed inductance of a circuit including power stage 900. First switching device 904 and second switching device 906 are respectively controlled by switching signals φ(1) and φ(2) generated by local control module 804 of FIG. 8. Magnitude of voltage $V_{con}$ is greater than or equal to magnitude of voltage $V_{bat}$ in power stage 900. Power stage 900 increases voltage magnitude from $V_{bat}$ to $V_{con}$ and supports bidirectional current flow. Electric power can flow in a direction 912, e.g., when a battery 110 electrically coupled to power stage 900 is discharging into source/load 106. Electric power can also flow in direction 914, e.g., when source/load 106 is charging a battery 110 electrically coupled to power stage 900.

Referring again to FIG. 8, local control module 804 is configured to generate switching signals φ in response to control signals C received from battery management controller 102. Additionally, local control module 804 is configured to monitor one or more of the following parameters and generate feedback signals F to convey these monitored parameters to battery management controller 102: (a) temperature (7) of a battery 110 electrically coupled to power converter 800, (b) voltage $V_{bat}$, (c) current $I_{bat}$, (d) voltage $V_{con}$, and (e) current $I_{bus}$. Local control module 804 is optionally further configured to include additional information in feedback signals F, such as information on a respective battery 110 (e.g., battery 110 type, manufacturing information for battery 110, operating history for battery 110, and/or maintenance history for battery 110). Furthermore, local control module 804 is configured to generate signals $S_1$, $S_2$, $S_3$, and $S_4$, for respectively controlling switching devices 808, 810, 812, and 814, in response to control signals C from battery management controller 102. Local control module 804 causes switching device 808 to open, for example, to isolate power stage 802 from its respective battery 110. Local control module 804 may cause switching device 810 to close to discharge a battery 110 electrically coupled to power stage 802, such as in an emergency, in response to determining that battery 110 is unsafe, or in preparation for electric power system 100 maintenance. In some embodiments, a resistor (not shown) is electrically coupled in series with switching device 810 to facilitate controlled discharge of the battery, or switching device 810 is replaced with a current source configured to perform a controlled discharge of the battery. Local control module 804 causes switching device 812 to open, for example, to isolate power stage 802 from electric power bus 108. Additionally, local control module 804 may cause switching device 814 to close to enable current $I_{bus}$ to bypass power stage 802.

Referring again to FIG. 1, inclusion of a respective power converter 112 between each battery 110 and electric power bus 108 buffers batteries 110 from electric power bus 108, as discussed above. Consequently, battery management controller 102 can individually control charging and discharging of each battery 110, thereby enabling battery management controller 102 to help maximize battery 110 throughput, battery 110 lifetime, and battery 110 safety. Additionally, certain embodiments of battery management controller 102 are configured to control operation of power converters 112 via control signals C in a matter which controls a respective bus contribution voltage of each battery 110, i.e. $V_{con}$ of each power converter 112, where bus contribution voltages $V_{con}$ sum to bus voltage $V_{bus}$ across source/load 106. As a result, a weaker battery 110 will not limit performance of a stronger battery 110 in stack 104. In a conventional stack where batteries are directly connected in series, in contrast, stack performance will be limited by a weakest battery in the stack. Furthermore, some embodiments of battery management controller 102 are configured to control operation of power converters 112 via control signals C to control current $I_{bus}$ flowing through power converter output ports 118 and 120.

Figure 10:
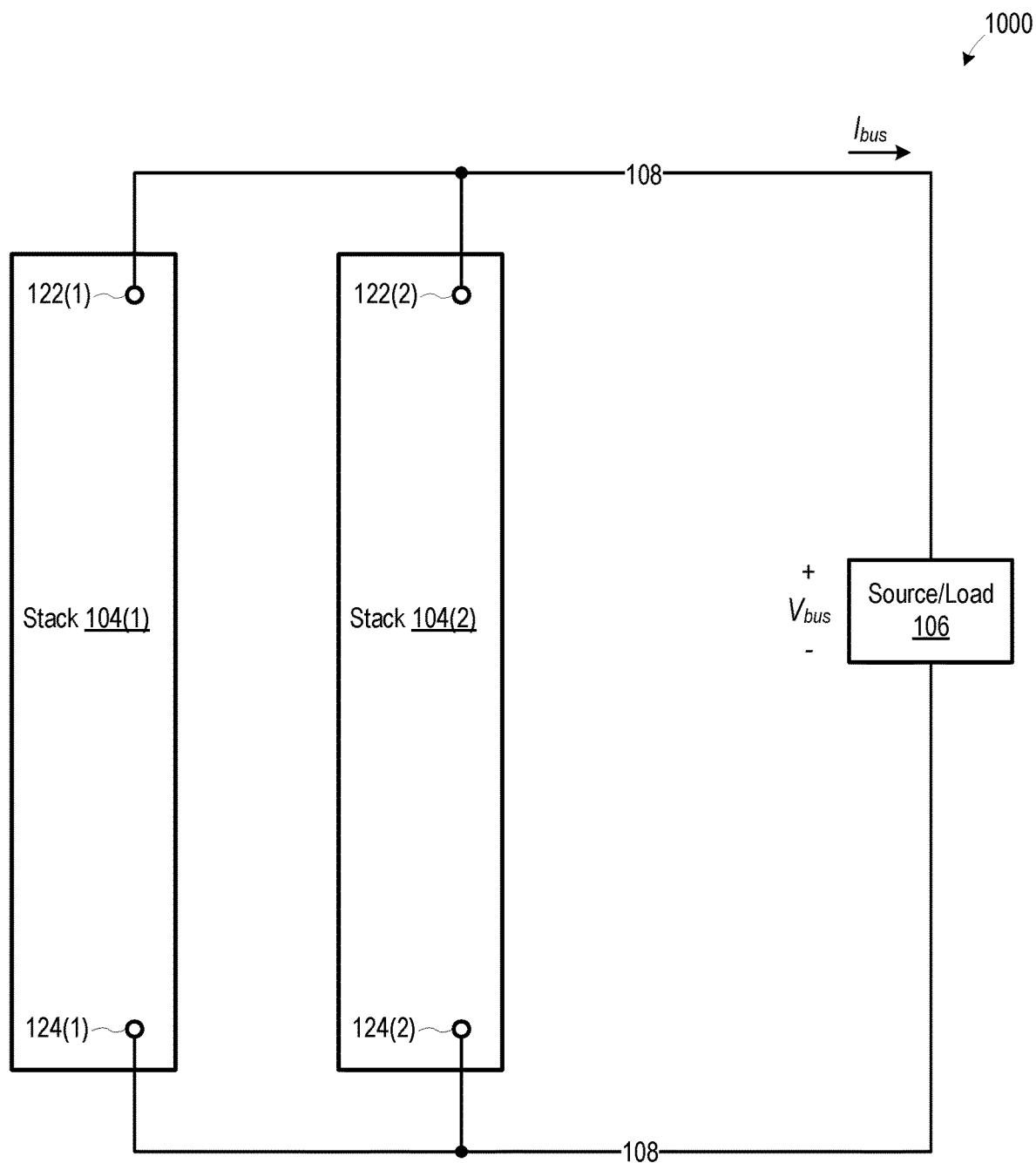
FIG. 10 is a schematic diagram of an alternate embodiment of the FIG. 1 electric energy storage system including two stacks.

Energy storage system 100 can be modified to include additional stacks 104 and/or have a different configuration of stacks 104. For example, FIG. 10 is a schematic diagram of an energy storage system 1000, which is an alternate embodiment of energy storage system 100 which includes two instances of stack 104, i.e. stacks 104(1) and 104(2). Battery management controller 102, as well as details of stacks 104(1) and 104(2), are not shown in FIG. 10 for illustrative clarity. Stacks 104(1) and 104(2) need not have the same configuration. For example, stacks 104(1) and 104(2) could have different numbers of batteries 110 and respective power converters 112, because battery management controller 102 can control the power converters 112 of each stack 104 to compensate for differing number of batteries 110 among stacks 104. Battery management controller 102 is also configured to control partitioning of current $I_{bus}$, and/or electrical power flow between stacks 104 and source/load 106, as well as among stacks 104(1) and 104(2).

Figure 11:
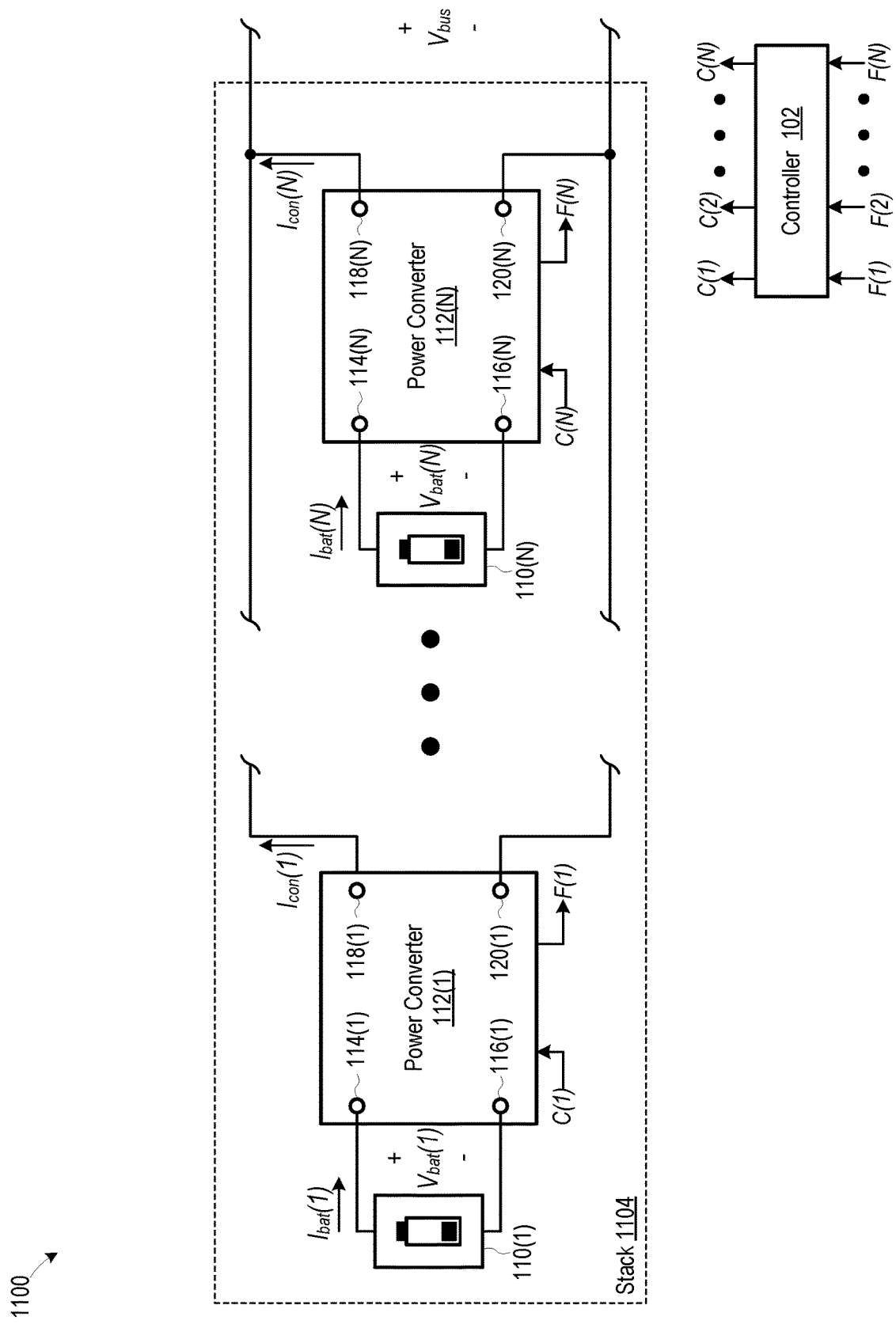
FIG. 11 is a schematic diagram of an alternate embodiment of the FIG. 1 energy storage system where batteries in a stack are indirectly electrically coupled in parallel via respective power converters.

FIG. 11 is a schematic diagram of an energy storage system 1100, which is an alternate embodiment of energy storage system 100 where stack 104 is replaced with a stack 1104. Batteries 110 are indirectly electrically coupled in parallel via their respective power converters 112 in stack 1104. Source/load 106 and electric power bus 108 are not shown in FIG. 11 for illustrative clarity. Voltage $V_{con}$ across each power converter 112's output ports 118 and 120 is equal to voltage $V_{bus}$ in electric power system 1100, due to the parallel connection of power converters 112 in stack 1104. However, each power converter 112 has a respective current $I_{con}$ flowing through its output ports 118 and 120 to electric power bus 108.

Referring again to FIG. 1, it is desirable to balance state of charge (SOC) of batteries 110, to promote battery throughput, battery lifetime, and battery safety. Balanced SOC may be substantially achieved, for example, by balancing voltages $V_{bat}$ of batteries 110 via appropriate control of power converters 112 by battery management controller 102. For example, certain embodiments of battery management controller 102 are configured to balance voltages $V_{bat}$ at least partially by (1) determining each voltage $V_{bat}$, e.g. from feedback signals F, and (2) controlling power converters 112 via control signals C to distribute power among batteries 110 based at least partially based on a difference between each voltage $V_{bat}$ and an average voltage $V_{bat,avg}$ of all batteries 110. For example, in certain embodiments, battery management controller 102 assigns a battery 110 with a smallest value of $V_{bat}$ the most power during charging, and battery management controller 102 assigns a battery 110 with a largest value of $V_{bat}$ the most power during discharging, to cause battery voltages $V_{bat}$ to at least substantially converge during a charge or discharge cycle or over multiple charge or discharge cycles.

Figure 12:
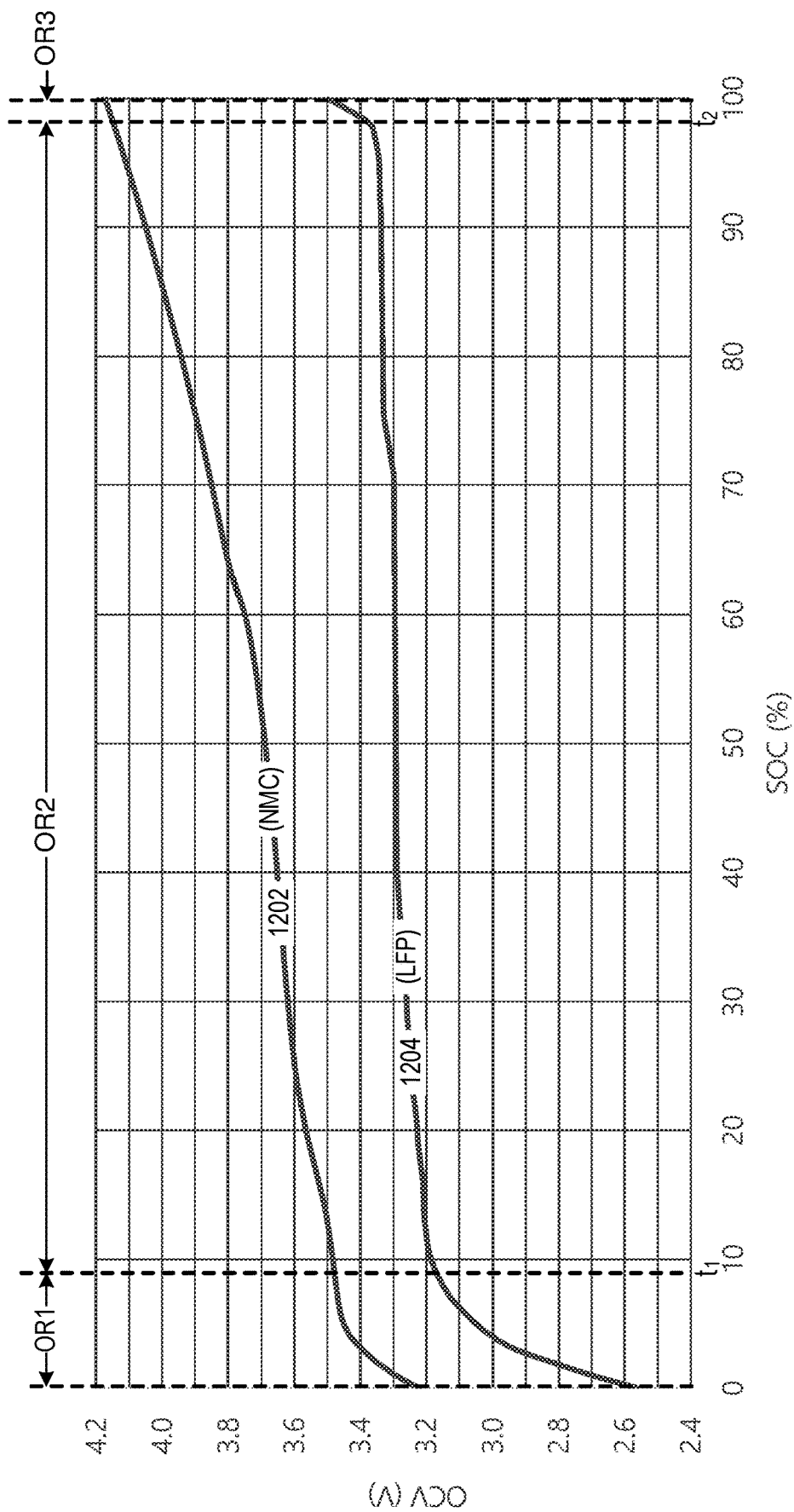
FIG. 12 is a graph of open circuit voltage versus state of charge for two different battery types.

Some batteries have a relatively flat voltage versus SOC curve during certain operating regions. For example, FIG. 12 is a graph of OCV versus SOC for a NMC battery consisting of a single NMC electrochemical cell and a LFP battery consisting of a single LFP electrochemical cell. Curve 1202 corresponds to the NMC battery, and curve 1204 corresponds to the LFP battery. Battery operation may be divided into three ranges in this example—operating region 1 (OR1), operating region 2 (OR2), and operating region 3 (OR3). Operating region 1 corresponds to small SOC, operating region 2 corresponds to moderate SOC, and operating region 3 corresponds to large SOC. As evident from FIG. 12, while the NMC battery has a significant slope in operating region 2, the LFP battery has minimal slope in operating region 2, where slope is equal to change in OCV over change in SOC ($\Delta OCV/\Delta SOC$). Operating region 2 for the LFP battery may be referred to as a "dead band" region for the LFP battery, due to the essentially flat OCV versus SOC curve during this region. It may be difficult to balance SOC among batteries 110 operating in their dead bands because battery voltage $V_{bat}$ does not appreciably change as the batteries are charged or discharged, and battery management controller 102 therefore receives minimal feedback during operation in the dead band region. For example, batteries may become unbalanced during dead band operation because there is little change in battery voltage as battery SOC varies. Consequently, batteries of a stack may exit the dead band at different times, causing pack charging or discharging to terminate early due to one or more out-of-balance batteries hitting a maximum or minimum threshold value, such as a voltage threshold value or a SOC threshold value, before other batteries of the stack. Furthermore, battery cells that are repeatedly cycled over a wider SOC range than other battery cells will degrade more rapidly than the other battery cells, shortening their life, and therefore, the life and lifetime energy throughput of a stack containing the battery cells.

Certain embodiments of battery management controller 102, however, are configured to mitigate effects of dead band operation on battery SOC balancing, which advantageously helps achieve maximum battery 110 energy throughput and maximum battery 110 life. For example, in some embodiments, when change in voltage of a first battery 110 of stack 104 reaches a threshold value, battery management controller 102 controls a respective power converter 112 of the first battery 110 to decrease charge or discharge rate of the first battery. The threshold value corresponds to, for example, either (1) a predetermined change in battery voltage or (2) a predetermined rate of change in battery voltage, such change in battery voltage over SOC or over time. Accordingly, the threshold value may correspond to a "knee" in a battery voltage versus SOC curve or a battery voltage versus time curve. For example, knees occur in the FIG. 12 LFP battery voltage curve at times $t_1$ and $t_2$. Decreasing charge or discharge rate of the first battery 110 when it reaches the threshold value or knee allows the remaining batteries in stack 104 to catch up with the first battery, i.e., for the remaining batteries 110 to approximately reach the same battery voltage as the first battery 110, thereby improving SOC balance among batteries 110 in stack 104. Battery management controller 102 returns the first battery 110 to normal operation, i.e., it increases charge/discharge rate of the first battery 110 to a normal value, in response to the remaining batteries 110 in stack 104 catching up with the first battery 110. Battery 110 voltage that is monitored during this operation is, for example, actual battery voltage $V_{bat}$, estimated open circuit voltage $V_{oc}$, or actual open circuit voltage $V_{oc}$.

The fact that each battery 110 is buffered from electric power bus 108 by a respective power converter 112 enables battery management controller 102 to decrease charge or discharge rate of the first battery 110 independent of other batteries 110 of stack 104. Additionally, in certain embodiments, battery management controller 102 is configured to change charge or discharge rate of one or more other batteries 110 in stack 104 to compensate for decreasing charge or discharge rate of the first battery 110 while mitigating effects of battery 110 dead band operation, such as to maintain constant magnitude of voltage $V_{bus}$ and/or power into or out of stack 104.

Figure 13:
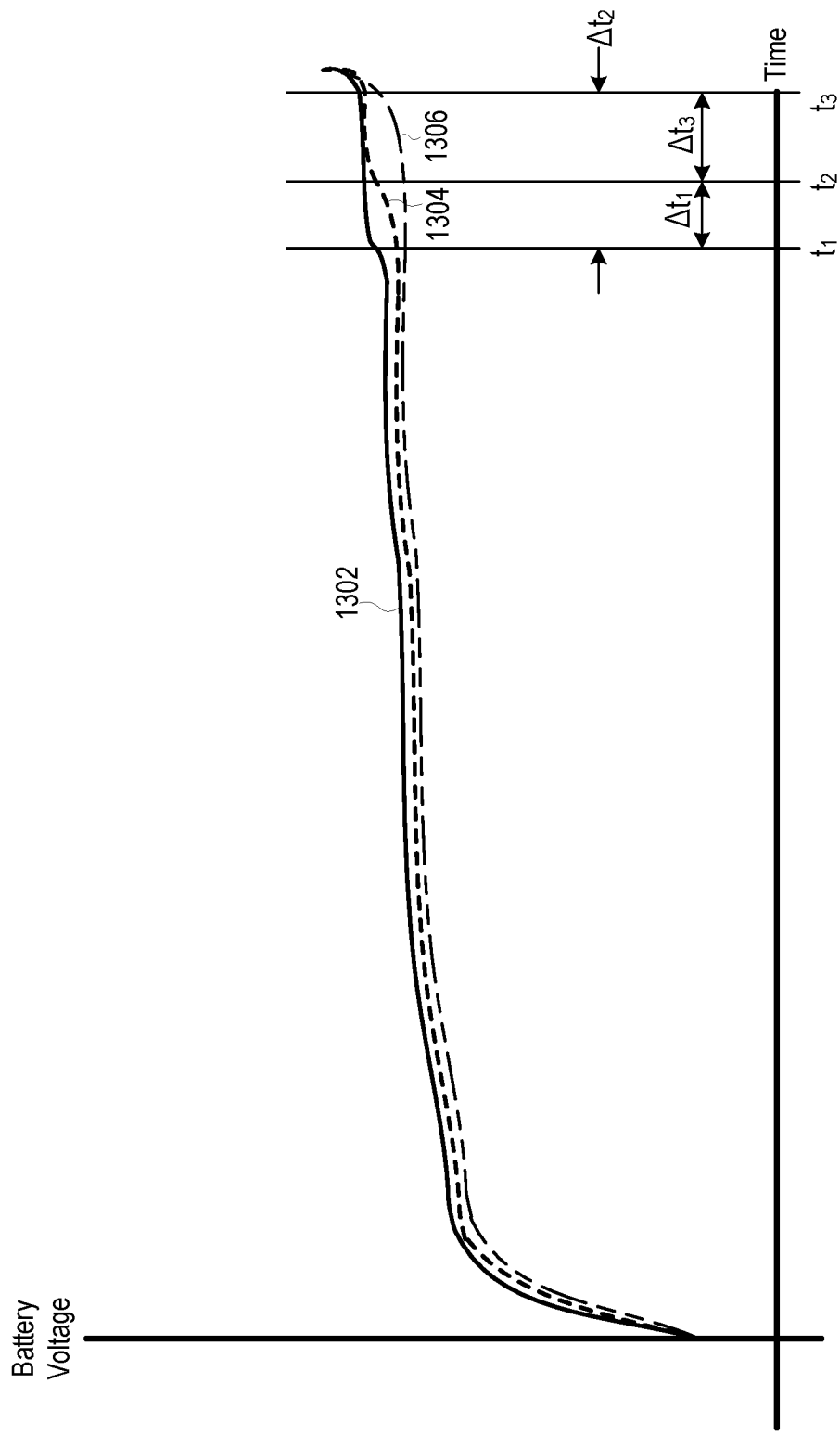
FIG. 13 is a graph of battery voltage versus time illustrating one example of operation of a battery management controller configured to mitigate effects of dead band operation on battery state of charge balance during charging, according to an embodiment.

FIG. 13 is a graph of battery voltage versus time illustrating one example of operation of an embodiment of battery management controller 102 configured to mitigate effects of dead band operation on SOC balancing during charging. The FIG. 13 example assumes that N is equal to three, i.e., there are three batteries 110 in stack 104. Curve 1302 corresponds to a voltage $V_{bat}(1)$ of a first battery 110(1) in stack 104, curve 1304 corresponds to a voltage $V_{bat}(2)$ of a second battery 110(2) in stack 104, and curve 1306 corresponds to a voltage $V_{bat}(3)$ of a third battery 110(3) in stack 104. Voltages of the batteries 110 are, for example, either actual battery voltage $V_{bat}$, estimated open circuit voltage $V_{oc}$, or actual open circuit voltage $V_{oc}$. Voltage $V_{bat}(1)$ of first battery 110(1) reaches a threshold value, corresponding to a predetermined change in battery voltage, at time $t_1$. In response, battery management controller 102 reduces a charge rate of the first battery 110(1), to allow second and third batteries 110(2) and 110(3) to catch up with the first battery 100(1). Voltage $V_{bat}(2)$ of second battery 110(2) reaches the threshold value at time $t_2$, and in response, battery management controller 102 reduces a charge rate of second battery 110(2), to allow third battery 110(3) to catch up with the first and second batteries. Voltage $V_{bat}(3)$ of third battery 110(3) reaches the threshold value at time $t_3$, and in response, battery management controller 102 increases respective charge rates of first and second batteries 110(1) and 110(2) and thereby returns the first and second batteries to normal operation. Third battery 110(3) continues normal operation after time $t_3$. Thus, battery management controller 102 approximately equalizes SOC of the three batteries 110 by time $t_3$.

Reducing charge rate of first battery 110(1) at time $t_1$ will change voltage $V_{bus}$ and power being absorbed by stack 104. Accordingly, some embodiments of battery management controller 102 are further configured to increase charge rate of one or more other batteries 110 at time $t_1$, to compensate for the decrease in charge rate of battery 110(1) at time $t_1$, and thereby maintain constant voltage $V_{bus}$ and/or power absorption of stack 104. Similarly, some embodiments of battery management controller 102 are further configured to increase charge rate of one or more other batteries 110 at time $t_2$, to compensate for the decrease in charge rate of battery 110(2) at time $t_2$, and thereby maintain constant voltage $V_{bus}$ and/or power absorption of stack 104. Increasing charge rate of one or more batteries to compensate for decrease in charge rate of other batteries may also advantageously reduce time required for batteries at lower SOC to catch up with batteries at higher SOC.

Figure 14:
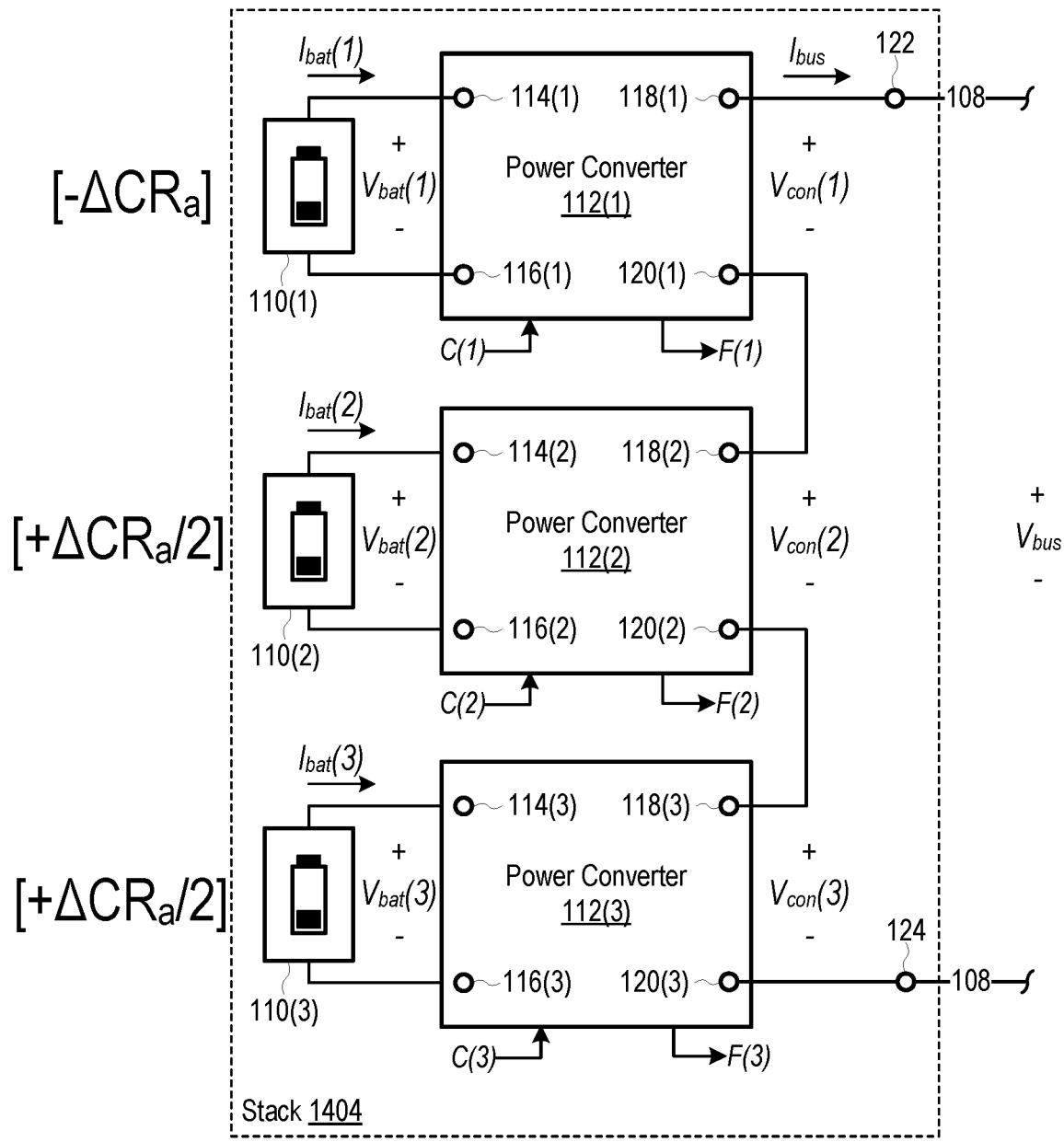
FIG. 14 is a schematic diagram of a stack illustrating an example of how a battery management controller may compensate for decreasing charge rate of a battery of the stack, according to an embodiment.

For example, FIG. 14 is a schematic diagram of a stack 1404, which is an embodiment of stack 104 including the three instances of battery 110, i.e., batteries 110(1)-110(3) discussed above in the example of FIG. 13. FIG. 14 includes notation to the left of each battery 110 indicating an example change in charge rate at time $t_1$. In the FIG. 14 example, battery management controller 102 controls power converter 112(1) to reduce charge rate of battery 110(1) by $\Delta CR_a$, at time $t_1$ to allow SOC of batteries 110(2) and 110(3) to catch up with SOC of battery 110(1). Battery management controller 102 also controls power converters 112(2) and 112(3) to increase respective charge rates of batteries 110(2) and 110(3) at time $t_1$ by $\Delta CR_a/2$ to compensate for the decrease in charge rate of battery 110(1), thereby maintaining constant $V_{bus}$ and power absorbed by stack 1404.

Figure 15:
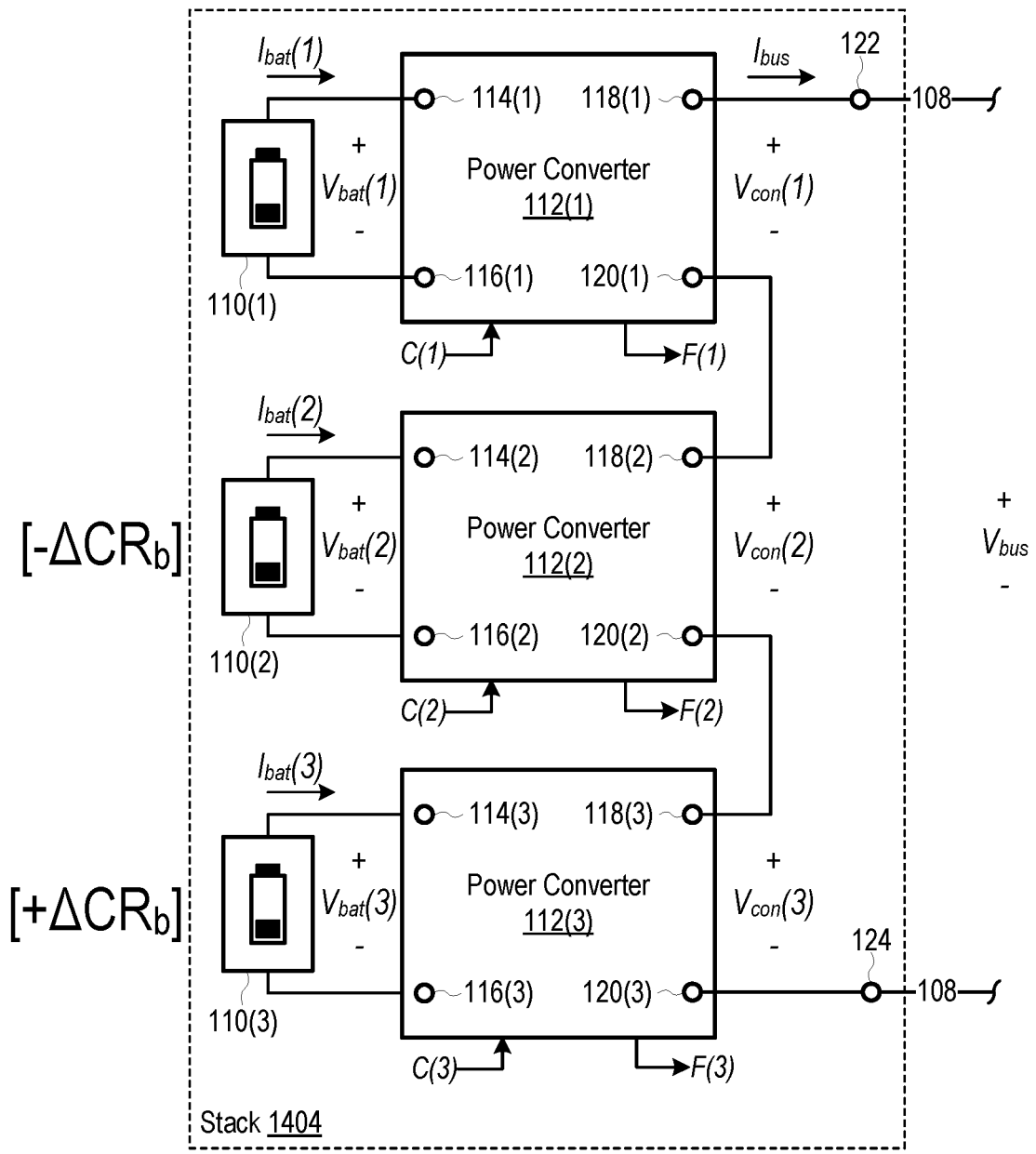
FIG. 15 is a schematic diagram of a stack illustrating another example of how a battery management controller may compensate for decreasing charge rate of a battery of the stack, according to an embodiment

Additionally, FIG. 15 is a schematic diagram of stack 1404 illustrating an example of how battery management controller 102 might adjust battery charge rate to compensate for decrease in charge rate of battery 110(2) at time $t_2$. In this example, battery management controller 102 controls power converter 112(2) to decrease charge rate of battery 110(2) by $\Delta CR_b$ at time $t_2$ to allow SOC of battery 110(3) to catch up to SOC of batteries 110(1) and 110(2). Battery management controller 102 also controls power converter 112(3) to increase rate of charge of battery 110(3) by $\Delta CR_b$ to compensate for the decrease in charge rate of battery 110(2), thereby maintaining constant $V_{bus}$ and power absorbed by stack 1404.

It is appreciated that battery management controller 102 could compensate for change of battery charge rates in manners other than those illustrated in the examples of FIGS. 14 and 15. For example, battery management controller 102 could (a) control power converter 112(2) to increase charge rate of battery 110(2) by $\Delta 3CR_a/4$ at time $t_1$ and (b) control power converter 112(3) to increase charge rate of battery 110(3) by $\Delta CR_a/4$ at time $t_1$, to compensate for decrease in charge rate of battery 110(1) $\Delta CR_a$ at time $t_1$, instead of implementing the method illustrated in FIG. 14.

Figure 16:
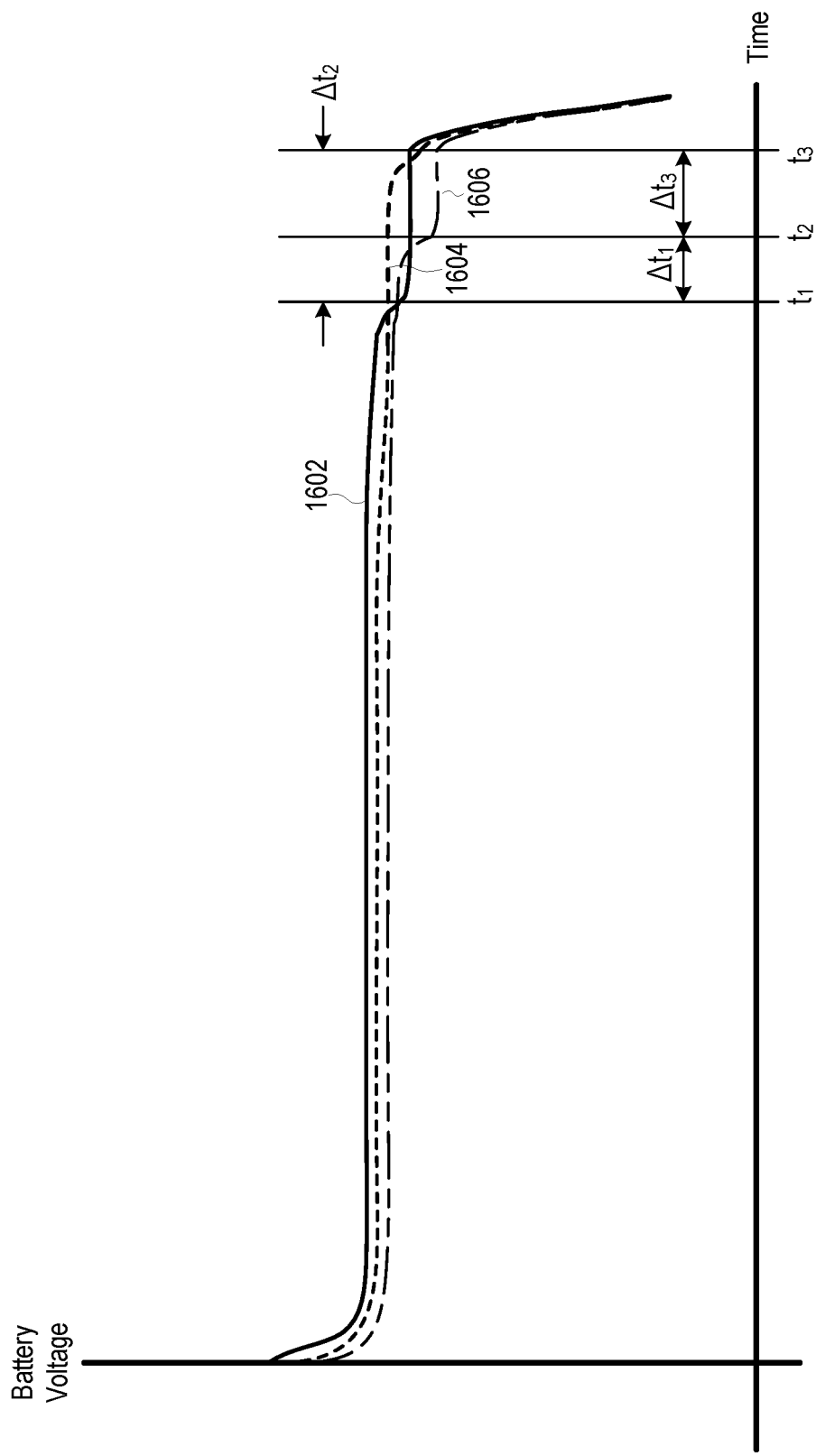
FIG. 16 is a graph of battery voltage versus time illustrating one example of operation of a battery management controller configured to mitigate effects of the dead band operation on battery state of charge balance during discharging, according to an embodiment.

FIG. 16 is a graph of battery voltage versus time illustrating one example of operation of an embodiment of battery management controller 102 configured to mitigate effects of dead band operation on SOC balancing during discharging. Like the FIG. 13 example, the FIG. 16 example assumes that N is equal to three, i.e., there are three batteries in stack 104. Curve 1602 corresponds to a voltage $V_{bat}(1)$ of a first battery 110(1) in stack 104, curve 1604 corresponds to a voltage $V_{bat}(2)$ of a second battery 110(2) in stack 104, and curve 1606 corresponds to a voltage $V_{bat}(3)$ of a third battery 110(3) in stack 104. Voltages of the batteries 110 are, for example, either actual battery voltage $V_{bat}$, estimated open circuit voltage $V_{oc}$, or actual open circuit voltage $V_{oc}$. Voltage $V_{bat}(1)$ of first battery 110(1) reaches a threshold value, corresponding to a predetermined change in battery voltage, at time $t_1$. In response, battery management controller 102 reduces a discharge rate of first battery 110(1), to allow the second and third batteries 110 to catch up with first battery 100(1). Voltage $V_{bat}(3)$ of third battery 110(3) reaches the threshold value at time $t_2$, and in response, battery management controller 102 reduces a discharge rate of the third battery 110(3), to allow second battery 110(2) to catch up with the first and third batteries. Voltage $V_{bat}(2)$ of second battery 110(2) reaches the threshold value at time $t_3$, and in response, battery management controller 102 increases discharge rate of first and third batteries 110(1) and 110(3) and thereby returns the first and third batteries to normal operation. Second battery 110(2) continues normal operation after time $t_3$. Thus, battery management controller 102 approximately equalizes SOC of the three batteries 110 by time $t_3$.

Reducing discharge rate of first battery 110(1) at time $t_1$ will change voltage $V_{bus}$ and power being provided by stack 104. Accordingly, some embodiments of battery management controller 102 are further configured to increase discharge rate of one or more other batteries 110 at time $t_1$, to compensate for the decrease in discharge rate of battery 110(1) at time $t_1$, and thereby maintain constant voltage $V_{bus}$ and/or power provided by stack 104 while compensating for battery 110(1) entering a dead band operating region. Similarly, some embodiments of battery management controller 102 are further configured to increase discharge rate of one or more other batteries 110 at time $t_2$, to compensate for the decrease in charge rate of battery 110(3) at time $t_2$, and thereby maintain constant voltage $V_{bus}$ and/or power provided by stack 104 while compensating for battery 110(3) entering a dead band operating region. Increasing discharge rate of one or more batteries to compensate for decrease in discharge rate of other batteries may also advantageously reduce time required for batteries at higher SOC to catch up with batteries at low SOC.

Figure 17:
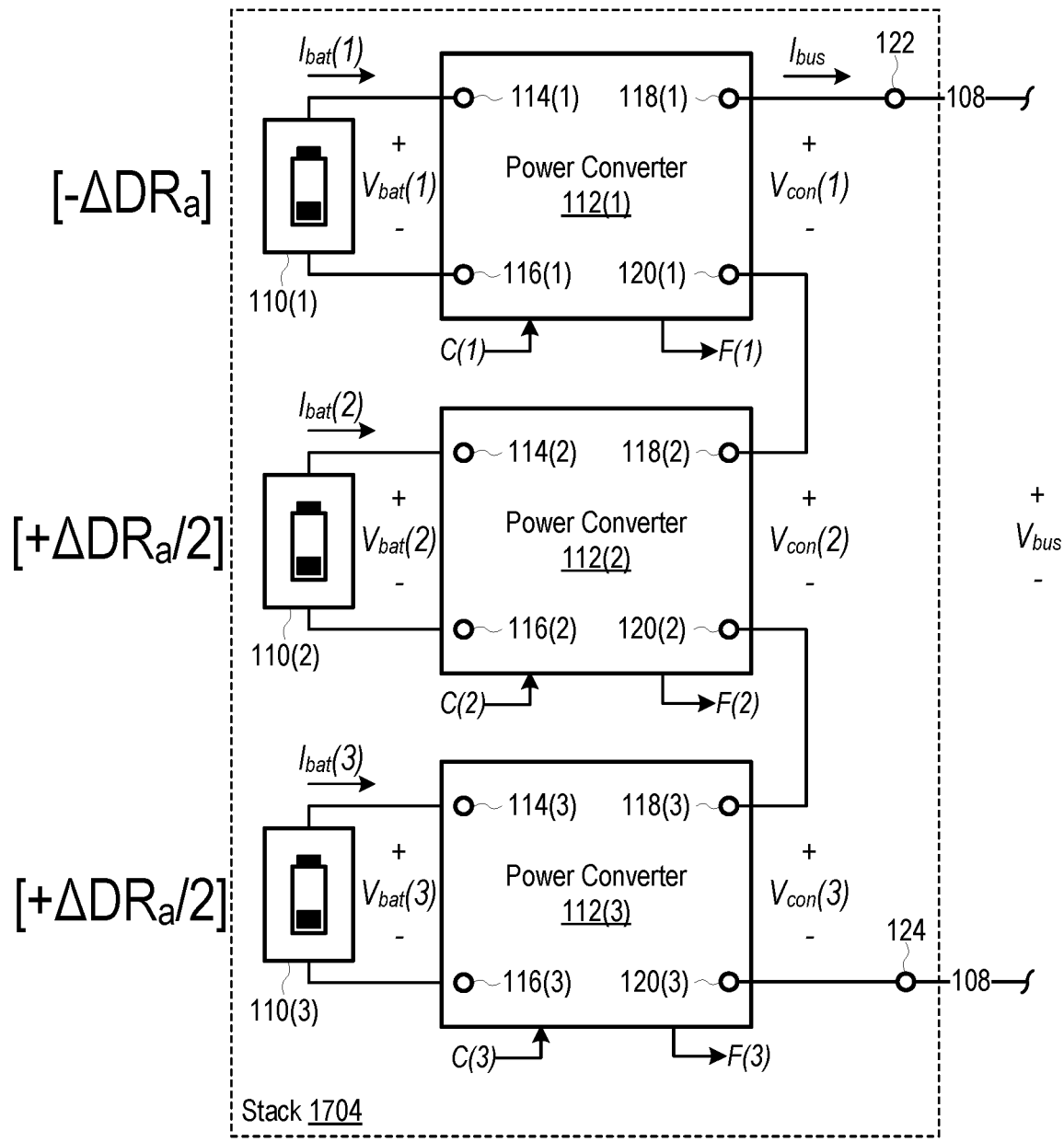
FIG. 17 is a schematic diagram of a stack illustrating an example of how a battery management controller may compensate for decreasing discharge rate of a battery of the stack, according to an embodiment.

For example, FIG. 17 is a schematic diagram of a stack 1704, which is an embodiment of stack 104 including the three instances of battery 110, i.e., batteries 110(1)-110(3) discussed above in the example of FIG. 16. FIG. 17 includes notation to the left of each battery 110 indicating an example change in discharge rate at time $t_1$. In the FIG. 17 example, battery management controller 102 controls power converter 112(1) to reduce discharge rate of battery 110(1) by $\Delta DR_a$, at time $t_1$ to allow SOC of batteries 110(2) and 110(3) to catch up with SOC of battery 110(1). Battery management controller 102 also controls power converters 112(2) and 112(3) to increase respective discharge rates of batteries 110(2) and 110(3) at time $t_1$ by $\Delta DR_a/2$ to compensate for the decrease in discharge rate of battery 110(1), thereby maintaining constant $V_{bus}$ and power provided by stack 1704.

Figure 18:
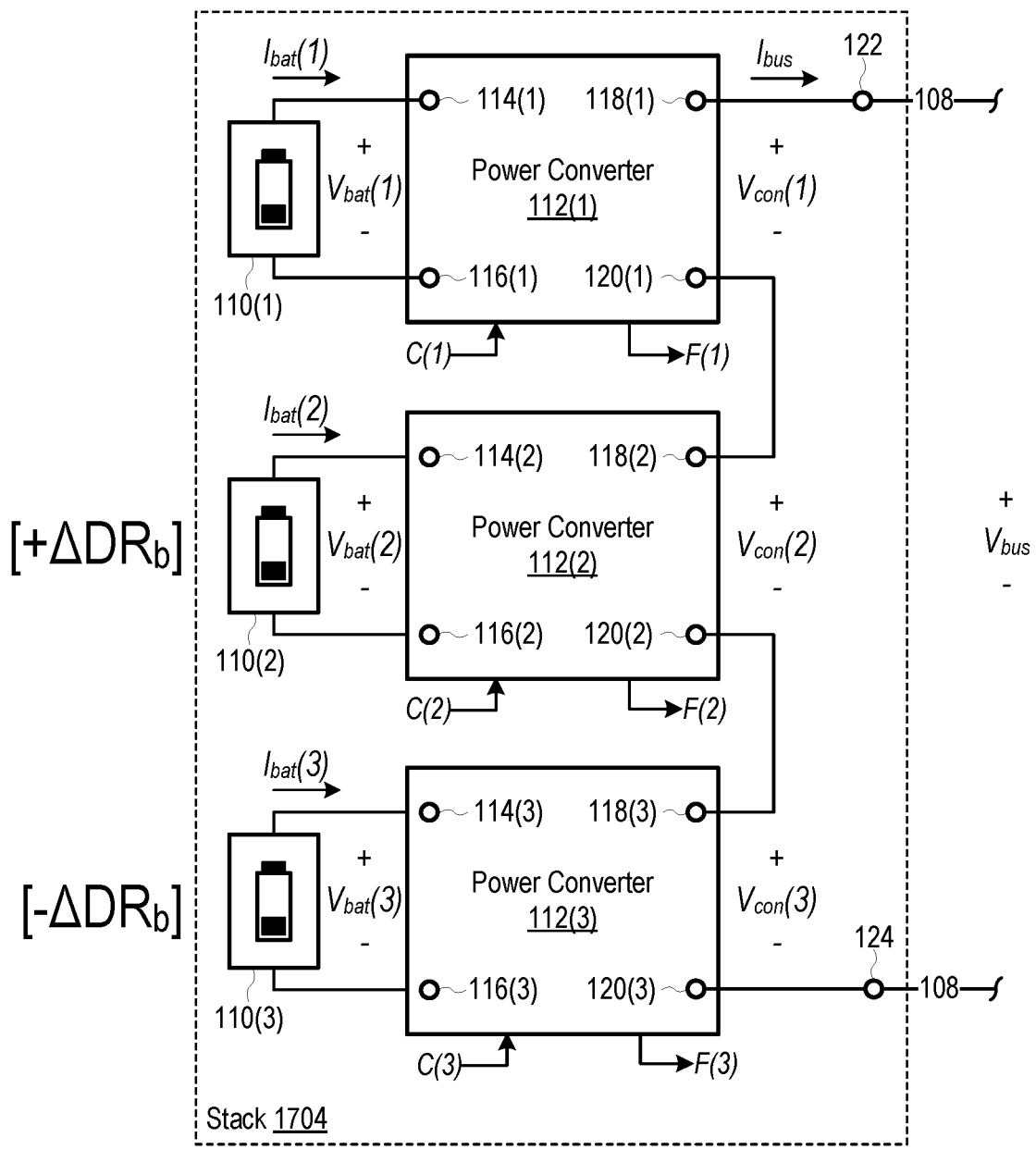
FIG. 18 is a schematic diagram of a stack illustrating an example of how a battery management controller may compensate for decreasing discharge rate of a battery of the stack, according to an embodiment.

Additionally, FIG. 18 is a schematic diagram of stack 1704 illustrating an example of how battery management controller 102 might adjust battery discharge rate to compensate for decrease in discharge rate of battery 110(3) at time $t_2$. In this example, battery management controller 102 controls power converter 112(3) to decrease discharge rate of battery 110(3) by $\Delta DR_b$ at time $t_2$ to allow SOC of battery 110(2) to catch up to SOC of batteries 110(1) and 110(3). Battery management controller 102 also controls power converter 112(2) to increase rate of discharge of battery 110(2) by $\Delta DR_b$ to compensate for the decrease in discharge rate of battery 110(3), thereby maintaining constant $V_{bus}$ and power provided by stack 1704.

In some embodiments, battery management controller 102 is further configured to adapt charge and discharge rates of batteries 110 in stack 104 so that all batteries reach a threshold value, corresponding to a knee of battery voltage versus SOC curve or a battery voltage versus time curve, at substantially the same time. For example, referring again to FIG. 13, a difference in time between when the first battery 110 reaches the threshold value and when the second battery 110 reaches the threshold value is $\Delta t_1$, and a difference in time between when the first battery 110 reaches the threshold value and when the third battery reaches the threshold value is $\Delta t_2$. Additionally, a difference in time between when the second battery 110 reaches the threshold value and when the third battery reaches the threshold value is $\Delta t_3$. Some embodiments of battery management controller 102 are configured to adjust the respective charge rates of one or more of the first through third batteries 110 to minimize each of $\Delta t_1$, $\Delta t_2$, and $\Delta t_3$, so that all three batteries reach the threshold value at substantially the same time. For example, in response to the first battery 110 reaching the threshold value before the second and third batteries 110, battery management controller 102 may decrease the charge rate of the first battery 110 and/or increase the charge rates of the second and third batteries 110 in future charge cycles, to decrease each of $\Delta t_1$, $\Delta t_2$, and $\Delta t_3$ over one or more cycles.

In some embodiments, battery management controller 102 is configured to use an iterative process to minimize each of $\Delta t_1$, $\Delta t_2$, and $\Delta t_3$, such as by repeatedly (a) changing a battery charge rate, (b) evaluating an effect of the charge rate change on one or more of $\Delta t_1$, $\Delta t_2$, and $\Delta t_3$, and (c) changing the battery charge rate in the same direction, if the previous change in charge rate decreased $\Delta t_1$, $\Delta t_2$, and/or $\Delta t_3$, and changing the battery charge rate in the opposite direction, if the previous change in charge rate increased $\Delta t_1$, $\Delta t_2$, and/or $\Delta t_3$. Battery management controller 102 may continue this process, for example, until each of $\Delta t_1$, $\Delta t_2$, and $\Delta t_3$ reaches a predetermined minimum value. Additionally, some embodiments of battery management controller 102 are configured to at least partially use historical data from other energy storage systems, such specified in aggregate data 722 of FIG. 7, to determine how to adjust battery charge rate to minimize $\Delta t_1$, $\Delta t_2$, and $\Delta t_3$. Furthermore, certain embodiments of battery management controller 102 are configured to use artificial intelligence or machine learning, optionally in conjunction with aggregate data 722 of FIG. 7, to determine how to adjust battery charge rate to minimize $\Delta t_1$, $\Delta t_2$, and $\Delta t_3$.

Referring again to FIG. 16, a difference in time between when the first battery 110 reaches the threshold value and when the third battery 110 reaches the threshold value is $\Delta t_1$, and a difference in time between when the first battery 110 reaches the threshold value and when the second battery 110 reaches the threshold value is $\Delta t_2$. Additionally, a difference in time between when the third battery 110 reaches the threshold value and when the second battery 110 reaches the threshold value is $\Delta t_3$. Some embodiments of battery management controller 102 are configured to adjust the respective discharge rates of one or more of the first through third batteries 110 to minimize each of $\Delta t_1$, $\Delta t_2$, and $\Delta t_3$, so that all three batteries reach the threshold value at substantially the same time. For example, some embodiments of battery management controller 102 are configured to minimize each of $\Delta t_1$, $\Delta t_2$, and $\Delta t_3$ using one or more of the techniques discussed above with respect to FIG. 13, but by adjusting discharge rate instead of charge rate.

Furthermore, some embodiments of battery management controller 102 are configured to use feedback signals F from operation in both high SOC regions and low SOC regions to adjust charge and/or discharge rates so that all batteries 110 reach threshold values at substantially the same time. For example, battery management controller 102 may adjust discharge rate of a first battery 110 in response to the first battery 110 transitioning to a dead band region from a high SOC region at a different time than when a second battery 110 transitions from the high SOC region to the dead band region, to cause both batteries to transition to a low SOC region from the dead band region at substantially the same time. For instance, if the first battery 110 transitions to the dead band region from the high SOC region before the second battery 110, battery management controller 102 may reduce discharge rate of the first battery 110 relative to the second battery 110, so that the two batteries subsequently transition to the low SOC region from the dead band region at substantially the same time. Battery management control 102 may be configured to adjust battery 110 discharge rates using an iterative method and/or a machine learning method so that all batteries 110 transition between a dead band region and a low SOC region at substantially the same time.

Additionally, battery management controller 102 may adjust a charge rate of a first battery 110 in response to the first battery 110 transitioning to a dead band region from a low SOC region at a different time than when a second battery 110 transitions from the low SOC region to the dead band region, to cause both batteries to transition to a high SOC region from the dead band region at substantially the same time. For instance, if a first battery 110 enters the dead band region from the low SOC region before a second battery 110, battery management controller 102 may reduce charge rate of the first battery 110 relative to the second battery 110, so that the two batteries subsequently enter the high SOC region from the dead band region at substantially the same time. Battery management control 102 may be configured to adjust battery 110 charge rates using an iterative method and/or a machine learning method so that all batteries 110 transition between a dead band region and a high SOC region at substantially the same time.

Alternately or additionally, battery management controller 102 may be configured to account for variations in endpoint SOC values of batteries 110 when determining charge and/or discharge rates, so that all batteries 110 transition between a dead band region and a high or low SOC region at substantially the same time. For example, consider a hypothetical scenario where a first battery 110 is at a higher SOC than a second battery 110 at an end of a charge cycle. Battery management controller 102 may be configured to increase a discharge rate of the first battery 110 relative to the second battery 110 to compensate for the difference in SOC of the two batteries at the end of the charge cycle, so that both batteries 110 transition from a dead band region to a low SOC region at substantially the same time during discharging. As another example, consider a hypothetical scenario where a first battery 110 is at a lower SOC than a second battery 110 at an end of a discharge cycle. Battery management controller 102 may be configured to increase a charge rate of the first battery 110 relative to the second battery 110 to compensate for the difference in SOC of the two batteries at the end of the discharge cycle, so that both batteries 110 transition from the dead band region to a high SOC region at substantially the same time during charging. Battery management controller 102 may be configured to use an iterative method and/or a machine learning method to determine required adjustments to battery 110 charge and/or discharge rates to compensate for variations in endpoint SOC values of batteries 110. Battery management controller 102 may be further configured to determine SOC from battery 110 voltage during rest periods at the beginning and end of charge and discharge cycles. A battery 110 is not charged or discharged during a rest cycle, and measured battery voltage during a rest cycle therefore represents true open circuit voltage of the battery. Accordingly, it may be advantageous to measure battery 110 voltage during a rest cycle, when feasible, to obtain battery open circuit voltage and eliminate need for estimating open circuit voltage.

FIG. 19 is a flow chart of a method 1900 for managing a plurality of batteries that are electrically coupled together, to mitigate effects of dead band operation on battery SOC balancing. In a block 1902 of method 1900, respective voltages of the plurality of batteries are monitored. In one example of block 1902, battery management controller 102 monitors respective voltages $V_{bat}$ of batteries 110, respective estimated open circuit voltages $V_{oc\_est}$ of batteries 110, or respective actual open circuit voltages $V_{oc}$, at least partially based on feedback signals F. In a block 1904 of method 1900, a charge or discharge rate of a first battery of the plurality of batteries is reduced, relative to at least a second battery of the plurality of batteries, in response to a respective voltage of first battery reaching a first threshold value at a first time. In one example of block 1904, charge rate of the first battery discussed in FIG. 13 is reduced, in response to voltage of the first battery reaching the threshold value at time $t_1$, and a charge rate of one or more other batteries is optionally increased to compensate for the reduction in charge rate of the first battery. In another example of block 1904, discharge rate of the first battery discussed in FIG. 16 is reduced, in response to voltage of the first battery reaching the threshold value at time $t_1$, and a discharge rate of one or more other batteries is optionally increased to compensate for the reduction in discharge rate of the first battery.

In a block 1906 of method 1900, the respective charge or discharge rate of the first battery is increased at a second time that is after the first time, in response to a respective voltage of the second battery reaching the first threshold value. In one example of block 1906, charge rate of the first battery discussed in FIG. 13 is increased, in response to voltage of the third battery reaching the threshold value at time $t_3$. In another example of block 1906, discharge rate of the first battery discussed in FIG. 16 is increased, in response to voltage of the second battery reaching the threshold value at time $t_3$.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for managing a plurality of batteries that are electrically coupled together, the method comprising:
   (a) monitoring respective voltages of the plurality of batteries;
   (b) in response to a respective voltage of a first battery of the plurality of batteries reaching a first threshold value at a first time, reducing a charge or discharge rate of the first battery relative to at least a second battery of the plurality of batteries at least partially by changing operation of a first power converter electrically coupled to the first battery independently of operation of a second power converter electrically coupled to the second battery; and
   (c) after step (b), adaptively managing charge or discharge rates of the plurality of batteries to reduce a difference in time between when (i) the respective voltage of the first battery reaches the first threshold value and (ii) a respective voltage of the second battery reaches the first threshold value.

2. The method of claim 1, where the first and second power converters are electrically coupled in series.

3. The method of claim 1, further comprising increasing a charge or discharge rate of the second battery to compensate for reducing the charge or discharge rate of the first battery.

4. The method of claim 3, wherein increasing the charge or discharge rate of the second battery comprises changing operation of the second power converter electrically coupled to the second battery.

5. The method of claim 1, further comprising increasing the respective charge or discharge rate of the first battery in response to a respective voltage of the second battery reaching the first threshold value at a second time that is after the first time.

6. The method of claim 1, wherein adaptively managing charge or discharge rates of the plurality of batteries comprises changing a charge or discharge rate of the first battery relative to the second battery.

7. The method of claim 1, wherein adaptively managing charge or discharge rates of the plurality of batteries comprises changing a charge or discharge rate of the second battery relative to the first battery.

8. The method of claim 1, wherein adaptively managing charge or discharge rates of the plurality of batteries comprises using an iterative process to reduce the difference in time between when (i) the respective voltage of the first battery reaches the first threshold value and (ii) the respective voltage of the second battery reaches the first threshold value.

9. The method of claim 1, wherein the respective voltages of the plurality of batteries comprise one of (a) actual battery voltages, (b) actual battery open circuit voltages, and (c) estimated battery open circuit voltages.

10. The method of claim 1, wherein the first threshold value corresponds to one of (a) a knee in a battery voltage versus state of charge curve and (b) a knee in a battery voltage versus time curve.

11. The method of claim 1, wherein the first threshold value corresponds to one of (a) a predetermined change in the respective voltage of the first battery and (b) a predetermined rate of change in the respective voltage of the first battery.

12. The method of claim 1, wherein each battery is a battery module comprising either (a) a plurality of electrochemical cells or (b) a single electrochemical cell.

13. The method of claim 1, further comprising adaptively managing charge or discharge rates of the plurality of batteries to reduce a difference in time between when (i) the respective voltage of the first battery reaches the first threshold value and (ii) a respective voltage of a third battery of the plurality of batteries reaches the first threshold value.

14. A method for managing a plurality of batteries that are electrically coupled together, the method comprising:
（a) monitoring respective voltages of the plurality of batteries;
(b) in response to a respective voltage of a first battery of the plurality of batteries reaching a first threshold value at a first time, reducing a charge or discharge rate of the first battery relative to at least a second battery of the plurality of batteries; and
(c) after step (b), adaptively managing charge or discharge rates of the plurality of batteries at least partially by using historical data from an energy storage system to determine how to adjust a charge or discharge rate of one or more of the plurality of batteries, to reduce a difference in time between when (i) the respective voltage of the first battery reaches the first threshold value and (ii) the respective voltage of the second battery reaches the first threshold value.

15. A controller for managing a plurality of batteries that are electrically coupled together, comprising:
one or more memories; and
one or more processors communicatively coupled to the one or more memories, the one or more processors being configured to execute instructions stored in the one or more memories to:
monitor respective voltages of the plurality of batteries,
in response to a respective voltage of a first battery of the plurality of batteries reaching a first threshold value at a first time, reduce a charge or discharge rate of the first battery, relative to at least a second battery of the plurality of batteries, and
adaptively managing charge or discharge rates of the plurality of batteries, at least partially by using historical data from an energy storage system, to reduce a difference in time between when (i) the respective voltage of the first battery reaches the first threshold value and (ii) a respective voltage of the second battery reaches the first threshold value.

16. The controller of claim 15, wherein the one or more processors are further configured to execute instructions stored in the one or more memories to increase a charge or discharge rate of the second battery to compensate for reducing the charge or discharge rate of the first battery.

17. The controller of claim 15, wherein the one or more processors are further configured to execute instructions stored in the one or more memories to increase the respective charge or discharge rate of the first battery, in response to a respective voltage of the second battery reaching the first threshold value at a second time that is after the first time.

18. The controller of claim 15, wherein the one or more processors are further configured to execute instructions stored in the one or more memories to adaptively managing charge or discharge rates of the plurality of batteries to reduce a difference in time between when (i) the respective voltage of the first battery reaches the first threshold value and (ii) a respective voltage of a third battery of the plurality of batteries reaches the first threshold value.

\* \* \* \* \*